United States Patent
Hanashima et al.

(10) Patent No.: US 9,530,641 B2
(45) Date of Patent: Dec. 27, 2016

(54) METHOD FOR MANUFACTURING SEMICONDUCTOR DEVICE, SUBSTRATE PROCESSING APPARATUS, AND RECORDING MEDIUM

(71) Applicant: HITACHI KOKUSAI ELECTRIC INC., Tokyo (JP)

(72) Inventors: Takeo Hanashima, Toyama (JP); Jie Wang, Toyama (JP); Takaaki Noda, Toyama (JP)

(73) Assignee: HITACHI KOKUSAI ELECTRIC INC., Tokyo (JP)

( * ) Notice: Subject to any disclaimer, the term of this patent is extended or adjusted under 35 U.S.C. 154(b) by 0 days.

(21) Appl. No.: 14/647,290

(22) PCT Filed: Nov. 11, 2013

(86) PCT No.: PCT/JP2013/080417
§ 371 (c)(1),
(2) Date: May 26, 2015

(87) PCT Pub. No.: WO2014/080785
PCT Pub. Date: May 30, 2014

(65) Prior Publication Data
US 2015/0303054 A1 Oct. 22, 2015

(30) Foreign Application Priority Data
Nov. 26, 2012 (JP) ................................. 2012-257974

(51) Int. Cl.
*H01L 21/02* (2006.01)
*H01L 21/285* (2006.01)
(Continued)

(52) U.S. Cl.
CPC ......... *H01L 21/0262* (2013.01); *C23C 16/401* (2013.01); *C23C 16/4412* (2013.01);
(Continued)

(58) Field of Classification Search
None
See application file for complete search history.

(56) References Cited

U.S. PATENT DOCUMENTS

2003/0013320 A1   1/2003   Kim et al.

FOREIGN PATENT DOCUMENTS

JP   H09-77593 A    3/1997
JP   2002-367992 A  12/2002
(Continued)

OTHER PUBLICATIONS

May 26, 2015 International Preliminary Report on Patentability issued in International Application No. PCT/JP2013/084017.
(Continued)

*Primary Examiner* — Asok K Sarkar
(74) *Attorney, Agent, or Firm* — Oliff PLC

(57) ABSTRACT

There is provided a method for manufacturing a semiconductor device, including: forming a film on a substrate by performing a cycle a prescribed number of times, the cycle including: (a) supplying a source gas to the substrate in a process chamber; (b) exhausting the source gas remained in the process chamber; (c) supplying a reactive gas to the substrate in the process chamber; and (d) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

18 Claims, 11 Drawing Sheets

(51) Int. Cl.
*H01L 21/3205* (2006.01)
*C23C 16/40* (2006.01)
*C23C 16/455* (2006.01)
*C23C 16/44* (2006.01)
*C23C 16/52* (2006.01)

(52) U.S. Cl.
CPC ...... *C23C 16/455* (2013.01); *C23C 16/45527* (2013.01); *C23C 16/45546* (2013.01); *C23C 16/52* (2013.01); *H01L 21/0228* (2013.01); *H01L 21/02164* (2013.01); *H01L 21/02211* (2013.01); *H01L 21/02219* (2013.01); *H01L 21/02271* (2013.01); *H01L 21/02274* (2013.01); *H01L 21/28506* (2013.01); *H01L 21/28562* (2013.01); *H01L 21/32051* (2013.01)

(56) References Cited

FOREIGN PATENT DOCUMENTS

| JP | 2006-245089 A | 9/2006 |
| JP | 2012-142482 A | 7/2012 |

OTHER PUBLICATIONS

Dec. 10, 2013 International Search Report issued in International Application No. PCT/JP2013/080417.

273 HIGH FREQUENCY POWER SOURCE
267 ROTATION MECHANISM

METHOD FOR MANUFACTURING SEMICONDUCTOR DEVICE, SUBSTRATE PROCESSING APPARATUS, AND RECORDING MEDIUM

TECHNICAL FIELD

The present invention relates to a method for manufacturing a semiconductor device, a substrate processing apparatus, and a recording medium.

As a step of manufacturing steps of a semiconductor device, the step of forming a film on a substrate by supplying a source gas and a reactive gas to a substrate in a process chamber, is sometimes performed.

SUMMARY OF THE INVENTION

Problem to be Solved by the Invention

However, when a film is formed on the substrate, variation is generated in a concentration of the source gas in the process chamber, resulting in a non-uniform processing to the substrate in some cases. Therefore, for example when a plurality of substrates are housed in the process chamber, which are then processed simultaneously, the film thickness of the formed film is not uniform among substrates in some cases.

An object of the present invention is to improve uniformity of the film thickness of the film formed on the substrate.

Means for Solving the Problem

According to a first aspect of the present invention, there is provided a method for manufacturing a semiconductor device, including:

forming a film on a substrate by performing a cycle a prescribed number of times, the cycle including:

(a) supplying a source gas to the substrate in a process chamber;

(b) exhausting the source gas remained in the process chamber;

(c) supplying a reactive gas to the substrate in the process chamber; and (d) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

According to other aspect of the present invention, there is provided a substrate processing apparatus, including:

a process chamber configured to house a substrate;

a source gas supply system configured to supply a source gas into the process chamber;

a reactive gas supply system configured to supply a reactive gas into the process chamber;

an inert gas supply system configured to supply an inert gas into the process chamber;

an exhaust system configured to exhaust the process chamber; and a controller configured to control the source gas supply system, the reactive gas supply system, the inert gas supply system, and the exhaust system, so that forming a film on the substrate is performed by performing a cycle a prescribed number of times, the cycle including:

(a) supplying the source gas to the substrate in the process chamber;

(b) exhausting the source gas remained in the process chamber;

(c) supplying the reactive gas to the substrate in the process chamber; and (d) exhausting the reactive gas remained in the process chamber, wherein in (a), the source gas is supplied into the process chamber in a state that exhaust of the process chamber is substantially stopped, and thereafter the inert gas is supplied into the process chamber in a state that exhaust of the process chamber and supply of the source gas are substantially stopped.

According to further other aspect of the present invention, there is provided a computer readable non-transitory recording medium recording a program configured to cause a computer to execute forming a film on a substrate by performing a cycle a prescribed number of times, the cycle including:

(a) supplying a source gas to the substrate in a process chamber;

(b) exhausting the source gas remained in the process chamber;

(c) supplying a reactive gas to the substrate in the process chamber; and (d) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

Effect of the Invention

According to the present invention, it is possible to improve the uniformity of a film thickness of a film formed on a substrate.

DETAILED DESCRIPTION OF THE INVENTION

An Embodiment

An embodiment of the present invention will be described hereafter, with reference to FIG. 1 to FIG. 3.

(1) Whole Structure of a Substrate Processing Apparatus

Figure 1:
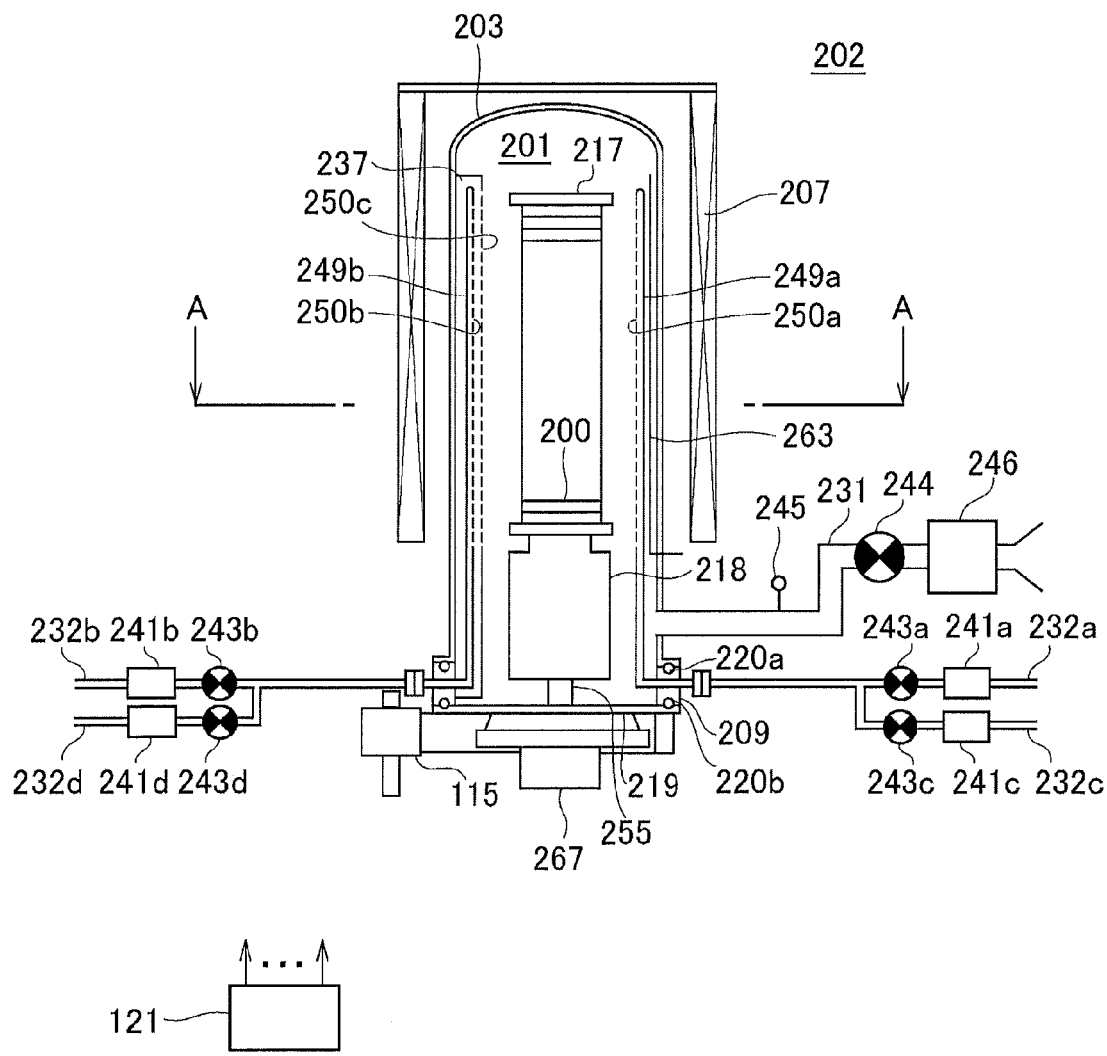
FIG. 1 is a schematic block diagram of a vertical processing furnace of a substrate processing apparatus suitably used in an embodiment of the present invention, and is a view showing a processing furnace portion in a vertical sectional view.

As shown in FIG. 1, a processing furnace 303 has a heater 207 as a heating unit (heating mechanism). The heater 207 has a cylindrical shape, and is installed on a heater base (not shown) being a holding plate by being supported thereby. Note that the heater 207 also functions as an activation mechanism for thermally activating (exciting) a gas as will be describe later.

A reaction tube 203 is disposed inside of the heater 207 concentrically with the heater 207. The reaction tube 203 is made of a heat-resistant material such as quartz ($SiO_2$) or silicon carbide (SiC), and is formed into a cylindrical shape with an upper end closed and a lower end opened. A manifold (inlet flange) 209 is disposed in a lower part of the reaction tube 203 concentrically with the reaction tube 203. The manifold 209 is made of a metal such as stainless (SUS) for example, and formed into a cylindrical shape with an upper end and a lower end opened. The upper end portion of the manifold 209 is fitted into the lower end portion of the reaction tube 203, so as to support the reaction tube 203. An O-ring 220a is provided between the manifold 209 and the reaction tube 203, as a seal member. By supporting the manifold 209 by a heater base, the reaction tube 203 is set in a vertically installed state. A processing vessel (reaction vessel) is mainly composed of the reaction tube 203 and the manifold 209. A process chamber 201 is formed in a cylindrical hollow part of the reaction tube 203, so that wafers 200 being substrates can be housed in a state of being arranged in multiple stages in a horizontal posture vertically by a boat 217 as will be described later.

Nozzles 249a and 249b are provided in the process chamber 201 so as to pass through a side wall of the manifold 209. Gas supply pipes 232a and 232b are respectively connected to the nozzles 249a and 249b. Thus, two nozzles 249a, 249b, and two gas supply pipes 232a, 232b are provided on the reaction tube 203, so that a plurality of kinds of gases, two kinds of gases here, can be supplied into the process chamber 201.

Mass flow controllers (MFCs) 241a, 241b, being a flow rate control units (flow rate controllers) and valves 243a, 243b, being open/close valves, are respectively provided on the gas supply pipes 232a, 232b, sequentially from an upstream direction. Gas supply pipes 232c, 232d supplying an inert gas, are respectively connected to a downstream side of the valves 243a, 243b of the gas supply pipes 232a, 232b. MFCs 241c, 241d, being flow rate control units (flow rate controllers) and valves 243c, 243d, being open/close valves, are respectively provided on the flow rate control units (flow rate controllers) sequentially from an upstream side.

Further, a nozzle 249a is connected to a tip end part of the first gas supply pipe 232a. As shown in FIG. 2, the nozzle 249a is provided to rise toward an upper part of a lamination direction of the wafers 200 extending from a lower part to the upper part of an inner wall of the reaction tube 203, in an annular space between the inner wall of the reaction tube 203 and the wafers 200. Namely, the nozzle 249a is provided in a region horizontally surrounding a wafer arrangement region at a side part of the wafer arrangement region in which wafers 200 are arranged, along the wafer arrangement region. The nozzle 249a is formed as an L-shaped long nozzle, with its horizontal part provided to pass through the side wall of the manifold 209, and its vertical part provided to rise toward the other end side from at least one end side of the wafer arrangement region. Gas supply holes 250a are formed on the side face of the nozzle 249a to supply gas. The gas supply holes 250a are opened to face the center of the reaction tube 203, so that the gas can be supplied to the wafers 200. A plurality of gas supply holes 250a are provided extending from a lower part to an upper part of the reaction tube 203, each of them having the same opening area and provided at the same opening pitch.

The nozzle 249b is connected to the tip end part of the gas supply pipe 232b. The nozzle 249b is provided in a buffer chamber 237 which is a gas dispersion space. As shown in FIG. 2, the buffer chamber 237 is provided in the annular space between the inner wall of the reaction tube 203 and the wafers 200, and in a part extending from the lower part to the upper part of the inner wall of the reaction tube 203, along a lamination direction of the wafers 200. That is, the buffer chamber 237 is provided in the region horizontally surrounding the wafer arrangement region, at the side part of the wafer arrangement region, along the wafer arrangement region. Gas supply holes 250c are formed at an end portion of a wall adjacent to the wafer 200 in the buffer chamber 237, to supply a gas. The gas supply holes 250c are opened to face the center of the reaction tube 203, so that the gas can be supplied to the wafers 200. A plurality of gas supply holes 250c are provided extending from the lower part to the upper part of the reaction tube 203, each of them having the same opening area and provided at the same opening pitch.

The nozzle 249b is provided at the end portion which is the opposite side of the end portion where the gas supply holes 250c are provided in the buffer chamber 237, extending from the lower part to the upper part of the inner wall of the reaction tube 203, so as to rise toward the upper part in the lamination direction of the wafers 200. That is, the nozzle 249b is provided in the region horizontally surrounding the wafer arrangement region, at the side part of the wafer arrangement region in which wafers 200 are arranged, and along the wafer arrangement region. The nozzle 249b is formed as an L-shaped long nozzle, with its horizontal part provided to pass through the side wall of the manifold 209, and its vertical part provided to rise toward the other end side from at least one end side of the wafer arrangement region. Gas supply holes 250b are formed on the side face of the nozzle 249b to supply gas. The gas supply holes 250b are opened to face the center of the buffer chamber 237. Similarly to the gas supply holes 250c, a plurality of gas supply holes 250b are provided extending from the lower part to the upper part of the reaction tube 203. When a differential pressure between the buffer chamber 237 and the process chamber 201 is small, an opening area and the opening pitch of the plurality of gas supply holes 250c may be the same extending from the upstream side (lower part) to the downstream side (upper part). Further, when the differential pressure between the buffer chamber and the process chamber is large, the opening area of the gas supply holes 250c may be gradually large from the upstream side to the downstream side, or the opening pitch of the gas supply holes 250c may be gradually small from the upstream side to the downstream side.

As described above, by adjusting the opening area or the opening pitch of the gas supply holes 250b from the upstream side to the downstream side, gas can be sprayed from each of the gas supply holes 250b with almost the same flow rate, although there is a difference in flow velocity. Then, by introducing the gas sprayed from each of the plurality of gas supply holes 250b into the buffer chamber 237, the difference in flow velocity of the gas can be made uniform in the buffer chamber 237. The gas sprayed into the buffer chamber 237 form each of the plurality of gas supply holes 250b, is ejected into the process chamber 201 from the plurality of gas supply holes 250c, with particle velocity of each gas relaxed in the buffer chamber 237. The gas ejected into the buffer chamber 237 from each of the plurality of gas supply holes 250b is the gas having uniform flow rate and flow velocity when it is ejected into the process chamber 201 from each of the gas supply holes 250c.

Thus, in this embodiment, gas is carried through the nozzles 249a, 249b, and the buffer chamber 237 arranged in the annular vertically long space which is the cylindrical space defined by the inner wall of the reaction tube 203 and the end portion of a plurality of stacked wafers 200. Then, the gas is ejected into the reaction tube 203 for the first time near the wafers 200, from the nozzles 249a, 249b and the gas supply holes 250a to 250c respectively opened in the buffer chamber 237. Then, a main gas flow in the reaction tube 203 is set in a direction parallel to the surface of the wafer 200, that is, in a horizontal direction. With this structure, the gas can be uniformly supplied to each wafer 200, and the uniformity of the film thickness of the film formed on each wafer 200 can be improved. The gas flowing on the surface of the wafer 200, that is, a residual gas after reaction flows toward an exhaust port, that is, an exhaust pipe 231 described later. However, such a direction of the flow of the residual gas is suitably specified depending on a position of the exhaust port, and is not limited to a vertical direction.

From the gas supply pipe 232a, for example, a silicon-based source gas which is a source gas (silicon-containing gas) containing at least silicon (Si) is supplied into the process chamber 201 through MFC 241a, valve 243a, and nozzle 249a, as a source containing a prescribed element.

The silicon-based source gas means a silicon-based source in a gas state, for example, means a gas obtained by vaporizing the silicon-based source in a liquid state at normal temperature and normal pressure, or a silicon-based source in a gas state at normal temperature and normal pressure, or the like. When using the term of "source" in this specification, this is a case meaning "a liquid source in a liquid state", a case meaning "a source gas in a gas state", or both cases. Accordingly, when using the "silicon-based source" in this specification, this is a case meaning "a silicon-based source in a liquid state", a case meaning "a silicon-based source gas in a gas state", or both cases. As the silicon-based source gas, for example, aminosilane-based source gas which is a source gas containing at least Si and amino-group (amine-group) can be used. The aminosilane-based source is a silane-based source having the amino-group, and is a silane-based source having alkyl-group such as methyl-group, ethyl-group, or butyl-group, etc., and is a source containing at least Si, nitrogen (N), and carbon (C). That is, the aminosilane-based source called here is also an organic source, and is also an organic aminosilane-based source. As the aminosilane-based source gas, for example bis tertiary butyl amino silane ($SiH_2[NH(C_4H_9)]_2$, abbreviated as BTBAS) gas can be used. When using a liquid source like BTBAS in a liquid state at normal temperature and normal pressure, the liquid source is vaporized by a vaporization system such as a vaporizer or a bubbler, etc., and is supplied as a source gas (BTBAS gas).

From the gas supply pipe 232b, for example an oxide gas, that is, a gas containing oxygen (oxygen-containing gas) is supplied as a reactive gas into the process chamber through the MFC 241b, valve 243b, gas supply pipe 232b, nozzle 249b, and buffer chamber 237. For example, oxygen ($O_2$) gas can be used as the oxygen-containing gas.

From the gas supply pipes 232c, 232d, for example nitrogen ($N_2$) gas is supplied as an inert gas into the process chamber 201 through MFCs 241c, 241d, valves 243c, 243d, gas supply pipes 232a, 232b, nozzles 249a, 249b, and buffer chamber 237.

When the abovementioned gas is flowed from each gas supply pipe, a source supply system supplying a source containing a prescribed element, that is, an aminosilane-based source gas supply system as a source gas supply system (silicon-based source gas supply system), is mainly composed of a gas supply pipe 232a, MFC 241a, and a valve 243a. The nozzle 249a may be included in the aminosilane-based source gas supply system. The aminosilane-based source gas supply system can be called an aminosilane-based source supply system.

Further, a reactive gas supply system supplying a reactive gas, that is, an oxide gas supply system supplying an oxide gas as the reactive gas (oxygen-containing gas supply system) is mainly composed of a gas supply pipe 232b, MFC 241b, and a valve 243b. The nozzle 249b and the buffer chamber 237 may be included in the oxide gas supply system. The oxide gas supply system can be called an oxidant supply system.

Further, an inert gas supply system is mainly composed of gas supply pipes 232c, 232d, MFCs 241c, 241d, and valves 243c, 243d. The inert gas supply system can be called a purge gas supply system.

Figure 2:
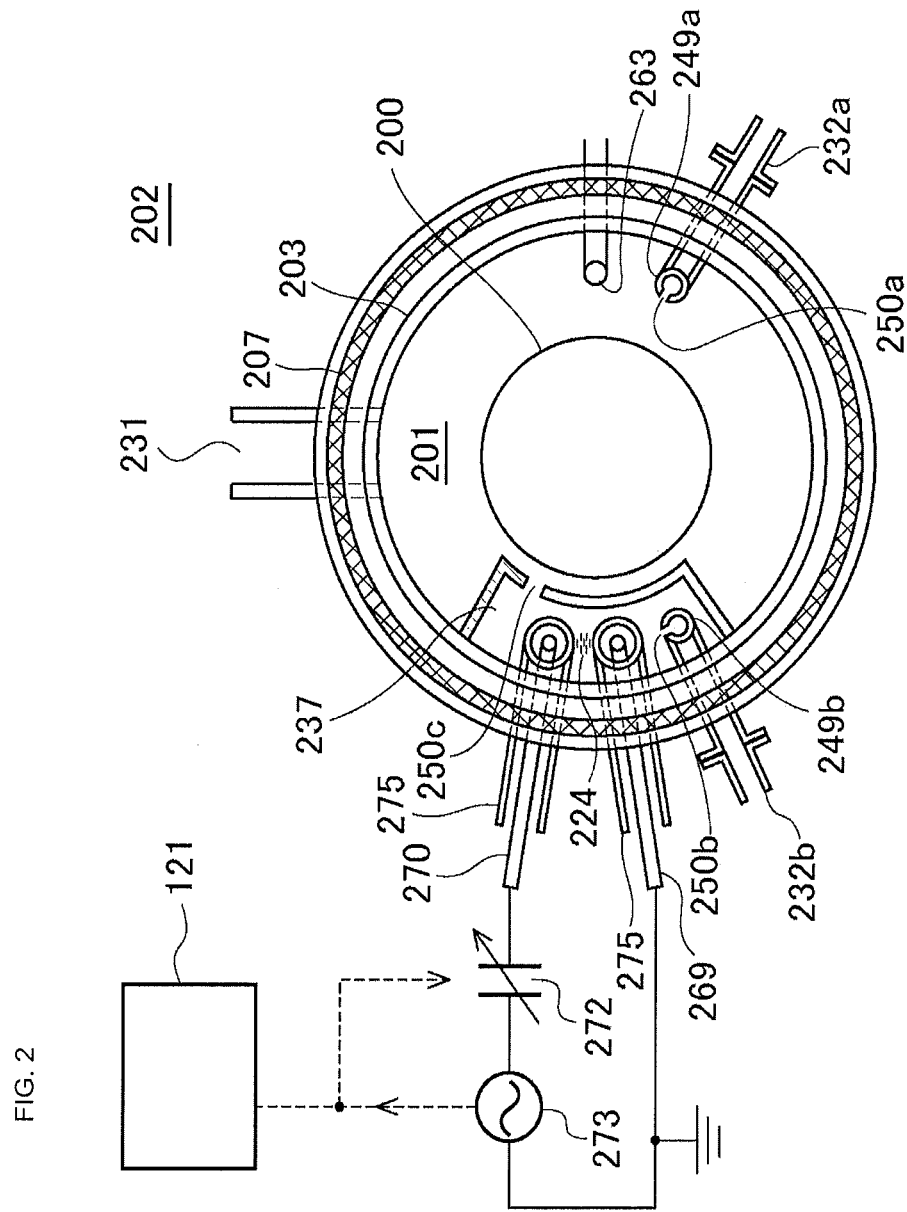
FIG. 2 is a schematic block diagram of the vertical processing furnace of the substrate processing apparatus suitably used in an embodiment of the present invention, and is a view showing the processing furnace portion taken along the A-A line of FIG. 1.

As shown in FIG. 2, in the buffer chamber 237, two rod-shaped electrodes 269, 270 made of a conductor and having an elongated structure are arranged along a stacking direction of the wafers 200 extending from the lower part to the upper part of the reaction tube 203. The rod-shaped electrodes 269, 270 are respectively provided in parallel to the nozzle 249b. The rod-shaped electrodes 269 and 270 are respectively protected by covering them by an electrode protective tube 275 extending from the upper part to the lower part. One of the rod-shaped electrodes 269 and 270 is connected to a high frequency power source 273 via a matching box 272, and the other one is connected to earth which is a reference potential. By applying high frequency wave (RF) between the rod-shaped electrodes 269 and 270 from the high frequency power source 273 via the matching box 272, plasma is generated in a plasma generation area 224 between the rod-shaped electrodes 269 and 270. A plasma source which is a plasma generator (plasma generation unit) is mainly composed of the rod-shaped electrodes 269, 270, and the electrode protective tube 275. The matching box 272 and the high frequency power source 273 may be included in the plasma source. The plasma source functions as an activation mechanism (excitation part) for activating (exciting) a gas described later in a plasma state.

The electrode protective tube 275 has a structure that can be inserted into the buffer chamber 237 in a state that the rod-shaped electrodes 269 and 270 are respectively isolated from an atmosphere in the buffer chamber 237. If an oxygen concentration inside of the electrode protective tube 275 is the same degree as the oxygen concentration of an outer air (atmosphere), the rod-shaped electrodes 269 and 270 respectively inserted into the electrode protective tube 275, are oxidized by a heater 207. By filling the inside of the electrode protective tube 275 with inert gas such as $N_2$ gas, or by purging the inside of the electrode protective tube 275 by the inert gas such as $N_2$ gas using an inert gas purge mechanism, the oxygen concentration inside of the electrode protective tube 275 can be reduced, and oxidation of the rod-shaped electrodes 269 and 270 can be prevented.

The reaction tube 203 is provided with the exhaust pipe 231 for exhausting the atmosphere in the process chamber 201. The exhaust pipe 231 has a vacuum pump 246 connected thereto as a vacuum exhaust device, via a pressure sensor 245 which is a pressure detector (pressure detection unit) for detecting a pressure in the process chamber 201, and an APC (Auto Pressure Controller) valve 244 which is an exhaust valve (pressure adjuster). The APC valve 244 is a valve capable of performing vacuum-exhaust and stop of the vacuum-exhaust of the inside of the process chamber 201, by opening and closing a valve while operating the vacuum pump 246, and further capable of adjusting the pressure in the process chamber 201 by adjusting a valve opening based on pressure information detected by a pressure sensor 245 while operating the vacuum pump 246. An exhaust system is mainly composed of the exhaust pipe 231, the APC valve 244, and the pressure sensor 245. The vacuum pump 246 may be included in the exhaust system. The exhaust pipe 231 is not limited to a case that it is provided on the reaction tube 203, and may be provided in the manifold 209 similarly to the nozzles 249a and 294b.

A seal cap 219 being a furnace throat lid member capable of air-tightly closing a lower end opening of the manifold 209, is provided in a lower part of the manifold 209. The seal cap 219 is abutted on a lower end of the manifold 209 from a vertically lower side. The seal cap 219 is made of metal such as SUS, etc., for example, and is formed into a disc shape. An O-ring 220b being a seal member abutted on the lower end of the manifold 209, is provided on an upper surface of the seal cap 219. A rotation mechanism 267 for rotating a boat is installed on an opposite side to the process chamber 201 of the seal cap 219. A rotary shaft 255 of the rotation mechanism 267 is configured to pass through the seal cap 219 so as to be connected to a boat 217 as will be described later, to rotate the wafer 200 by rotating the boat 217. The seal cap 219 is configured to be vertically elevated by a boat elevator 115 being an elevation mechanism vertically installed outside of the reaction tube 203, so that the boat 217 can be loaded and unloaded into/from the process chamber 201. The boat elevator 115 is configured as a transport device (transport mechanism) for transporting the boat 217 and the wafer 200 supported by the boat 217, to inside/outside of the process chamber 201.

The boat 217 which is a substrate supporting tool, is configured to support a plurality of (for example 25 to 200) wafers 200 in a horizontal posture so as to be vertically arranged in multiple stages with centers aligned with each other, that is, so as to be arranged with a space provided between them. The boat 217 is made of a heat-resistant material such as quartz or SiC, etc., for example. An insulation member 218 made of a heat-resistant material such as quartz or silicon carbide, etc., is provided in a lower part of the boat 217, so that heat from a heater 207 is hardly transmitted toward the seal cap 219. However, this embodiment is not limited to such a structure. For example, the heat-insulating member 218 may be composed of a plurality of heat-insulating plates made of a heat-insulating material such as quartz or silicon carbide, and a heat-insulating plate holder for supporting the heat-insulating plates in a horizontal posture in multiple stages.

A temperature sensor 263 is installed in the reaction tube 203 as a temperature detector. The temperature in the process chamber 201 is set in a desired temperature distribution by adjusting a power supply state to the heater 207 based on the temperature information detected by the temperature sensor 263. The temperature sensor 263 is formed into an L-shape similarly to the nozzles 249a and 249b, and is provided along the inner wall of the reaction tube 203.

Figure 3:
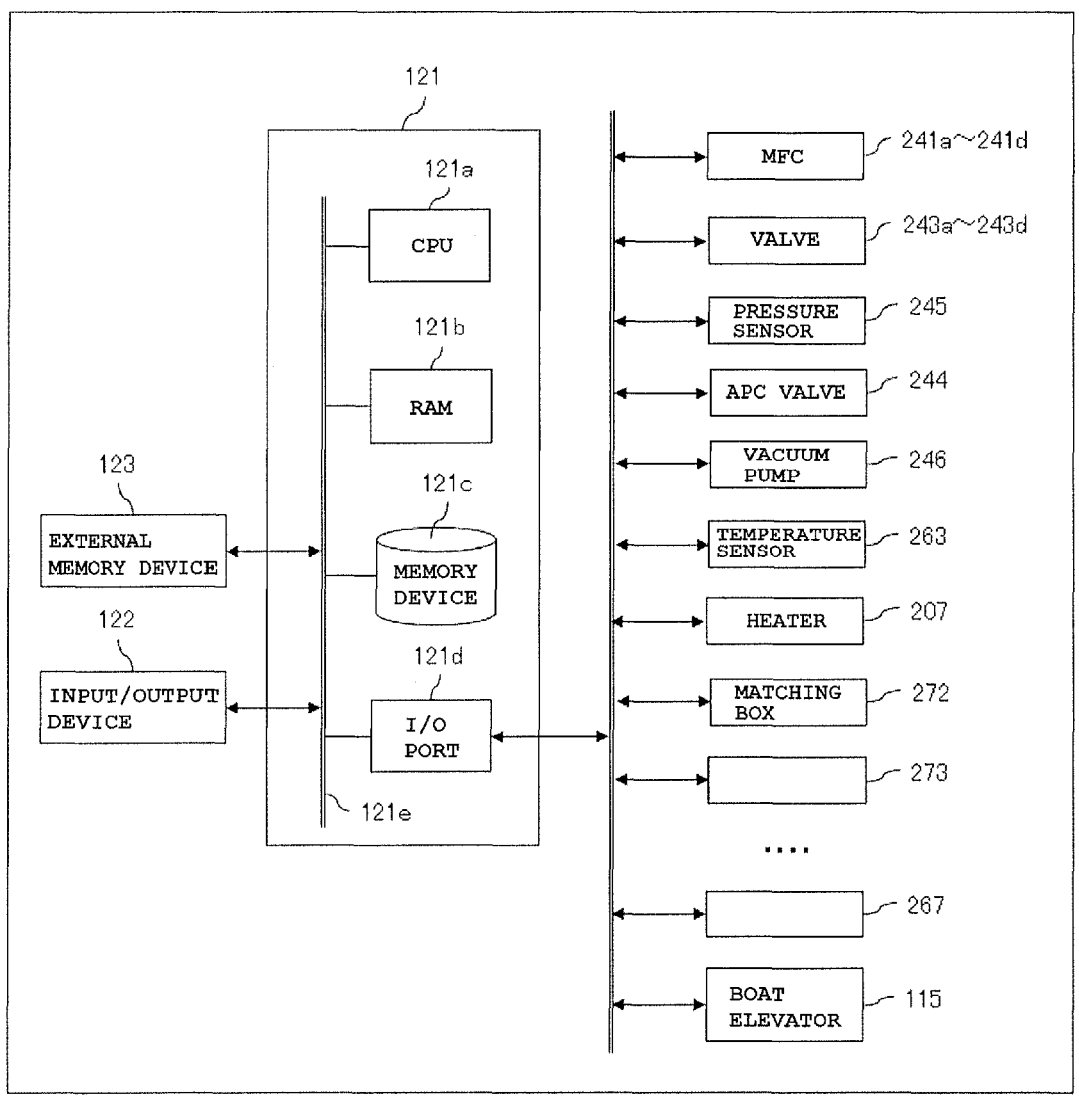
FIG. 3 is a schematic block diagram of a controller of the substrate processing apparatus suitably used in an embodiment of the present invention, and is a view showing a control system of a controller in a block diagram.

As shown in FIG. 3, the controller 121 which is the control unit (control means) is constituted as a computer including CPU (Central Processing Unit) 121a, RAM (Random Access Memory) 121b, and I/O port 121d. The RAM 121b, a memory device 121c, and the I/O port 121d are configured so that data exchange with CPU 121a can be carried out via an internal bus 121e. An input/output device 122 constituted as a touch panel, etc., for example, is connected to the controller 121.

The memory device 121c is constituted of a flash memory and HDD (Hard Disk Drive), etc., for example. A control program for controlling an operation of the substrate processing apparatus, and a process recipe, etc., in which a procedure or a condition of substrate processing described later, are readably stored in the memory device 121c. The process recipe is a combination of recipes so that each procedure in the substrate processing step described later is executed by the controller 121, and a prescribed result can be obtained, thereby functioning as a program. The program recipe and the control program, etc., are generally and simply called a program hereafter. The term of the program is used in the following cases in this specification, meaning the process recipe alone, meaning the control program alone, or meaning the both cases thereof. Further, the RAM 121b is constituted as a memory area (work area) in which the program or data, etc., read by the CPU 121a is temporarily stored.

The I/O port 121d is connected to the abovementioned MFCs 241a to 241d, valves 243a to 243d, pressure sensor 245, APC valve 244, vacuum pump 246, temperature sensor 263, heater 207, rotation mechanism 267, boat elevator 115, matching box 272, and high frequency power source 273, etc.

The CPU 121a is configured to read and execute a control program from the memory device 121c, and read the process recipe from the memory device 121c according to input, etc., of an operation command from the input/output device 122. Also, the CPU 121a is configured to control a flow adjustment operation of each kind of gas by MFCs 241a to 241d, an open/close operation of the valves 243a to 243d, a pressure adjustment operation by the APC valve 244 based on the open/close operation of the APC valve 244 and the pressure sensor 245, start and stop of the vacuum pump 246, a temperature adjustment operation of the heater 207 based on the temperature sensor 263, rotation of the boat 217 and a rotation speed adjustment operation by the rotation mechanism 267, an elevating operation of the boat 217 by the boat elevator 115, an impedance adjustment operation by the matching box 272, and a power supply of the high frequency power source 273, etc.

The controller 121 may be configured not only as a dedicated computer, but also as a general-purpose computer. For example, an external memory device 123 storing the abovementioned program (for example, a magnetic disc such as a magnetic tape or a flexible disc, an optical disc such as CD or DVD, etc., a magneto-optical disc such as MO, and a semiconductor memory such as a USB memory or a memory card, etc.,) is prepared, and the program is installed on the general-purpose computer using this external memory device 123, to thereby constitute the controller 121 of this embodiment. The means for supplying the program to the computer is not limited to the case that it is supplied via the external memory device 123. For example, the program may be supplied without passing through the external memory device 123, using a communication means such as an Internet or a dedicated line, etc. The memory device 121c and the external memory device 123 are configured as a non-transitory computer readable recording medium. They are genetically simply called a recording medium hereafter. The term of the recording medium is used in the following cases in this specification, meaning the memory device 121c alone, meaning the external memory device 123 alone, or meaning the both cases thereof.

(2) Film Forming Step

Next, explanation is given for a sequence example of forming a film on a substrate, as a step of the manufacturing steps of a semiconductor device, using a processing furnace 202 of the abovementioned substrate processing apparatus. In the following explanation, the operation of each part constituting the substrate processing apparatus, is controlled by the controller 121.

In this embodiment, the film forming step includes:

forming a film on a substrate by performing a cycle a prescribed number of times, the cycle including:

(a) supplying a source gas to the substrate in a process chamber;

(b) exhausting the source gas remained in the process chamber;

(c) supplying a reactive gas to the substrate in the process chamber; and (d) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

Figure 4:
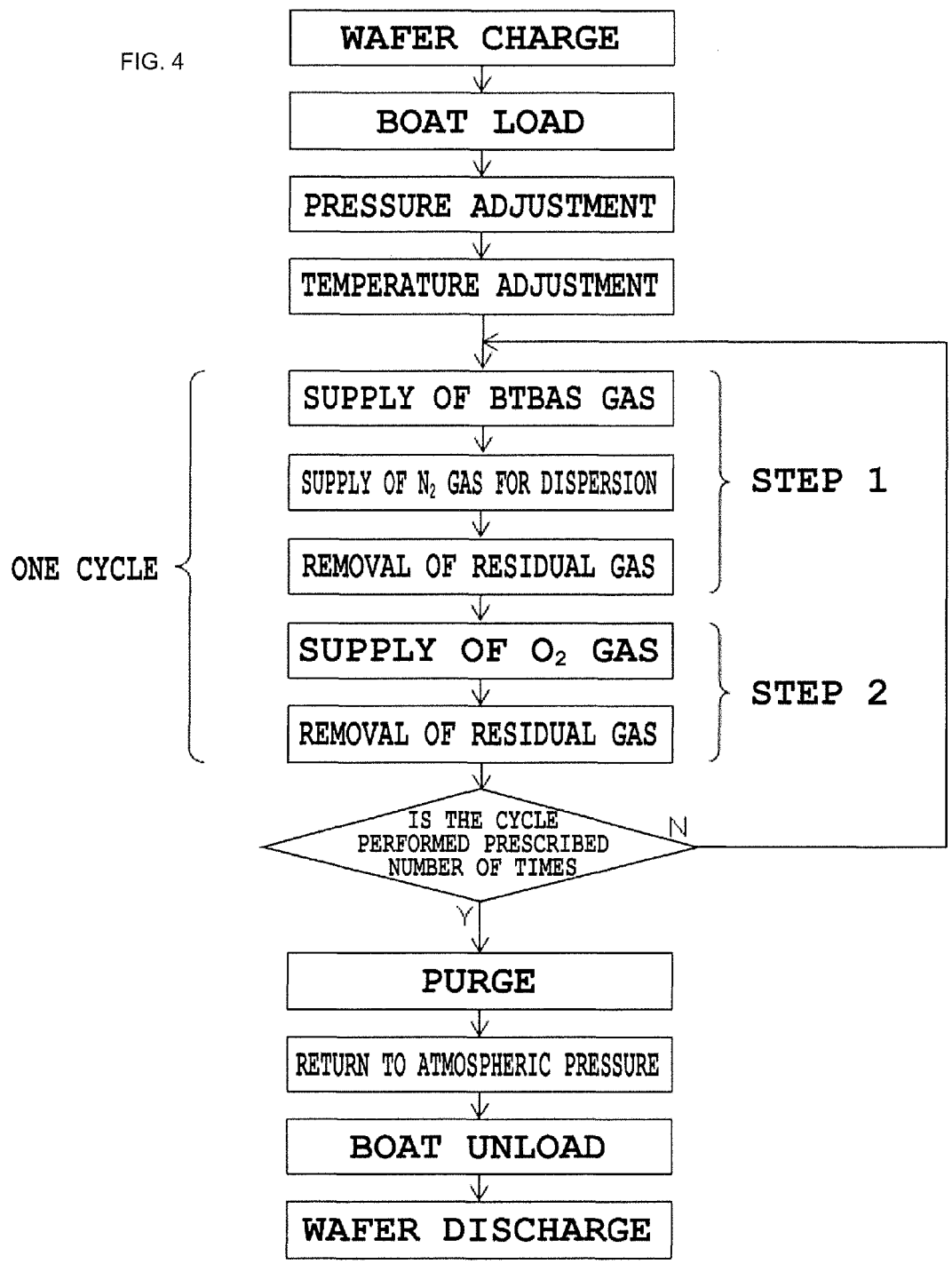
FIG. 4 is a view showing a film formation flow in a film formation sequence according to an embodiment of the present invention.
Figure 5:
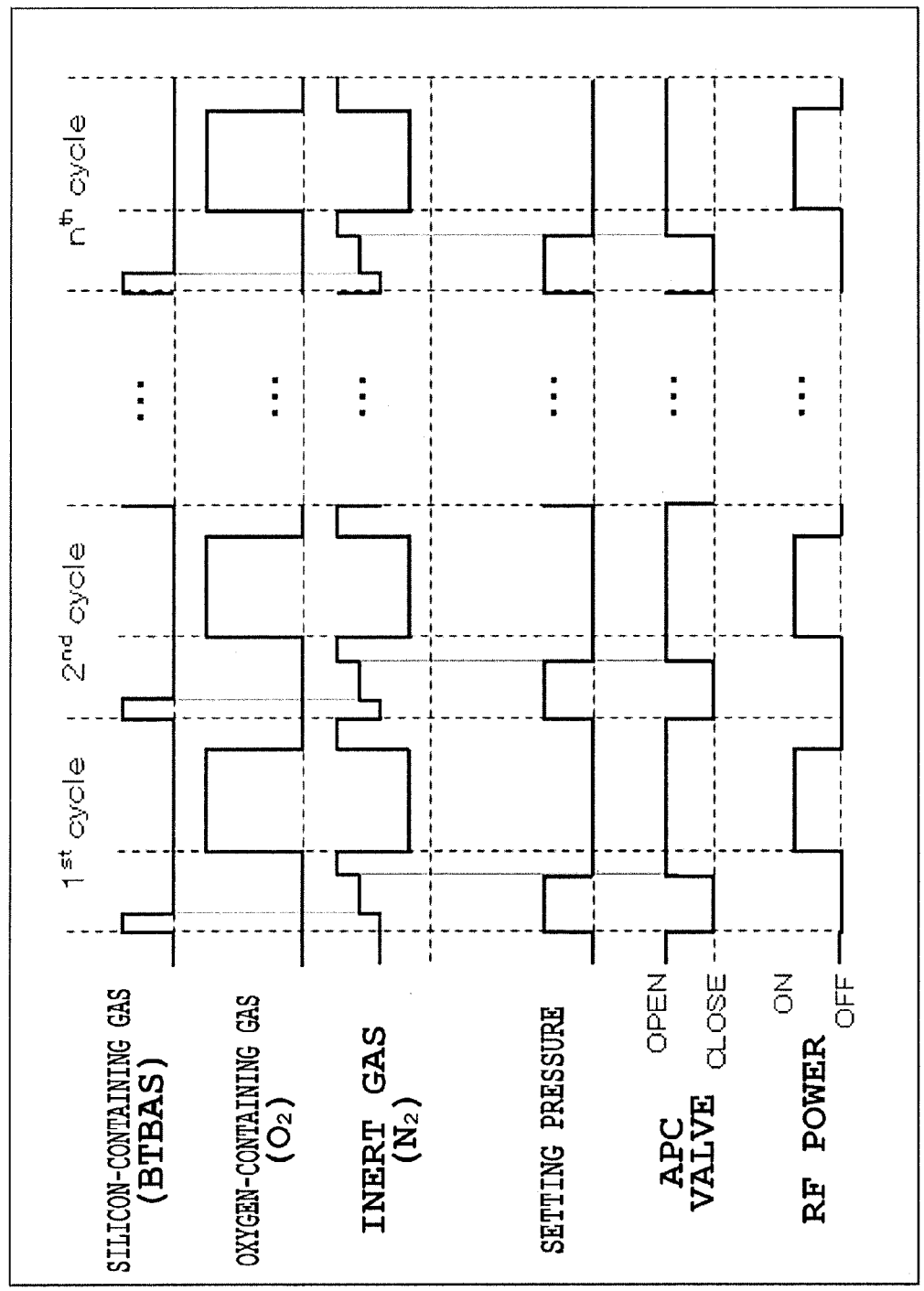
FIG. 5 is a view showing the timing of a gas supply, change of a setting pressure, open/close of an APC valve, and a high frequency power supply, in the film formation sequence according to an embodiment of the present invention.

The film formation sequence of this embodiment will be specifically described hereafter, using FIG. 4 and FIG. 5.

Here, explanation is given for an example of forming a silicon oxide film (called SiO film hereafter) on the wafer 200 by performing a cycle a prescribed number of times, the cycle including:

supplying BTBAS gas which is a silicon-containing gas as a source gas, to the wafer 200 in the process chamber 201;

exhausting the BTBAS gas remained in the process chamber 201;

supplying $O_2$ gas which is an oxygen-containing gas as a reactive gas to the wafer 200 in the process chamber 201; and exhausting the $O_2$ gas remained in the process chamber.

Here, in supplying the BTBAS gas to the wafer 200, the BTBAS gas is supplied into the process chamber 201 in a state that exhaust in the process chamber 201 is substantially stopped, and thereafter $N_2$ gas is supplied into the process chamber 201 as an inert gas in a state that exhaust in the process chamber 201 and supply of the BTBAS gas are substantially stopped.

In this specification, when using the term "wafer" as used herein, this is a case meaning "a wafer itself", or a case meaning "a lamination body (aggregate) of a wafer and a prescribed layer or a film formed thereon", that is, there is a case that the wafer includes the prescribed film or layer, etc., formed the surface. In this specification, when using the term of "the surface of the wafer", this is a case meaning "the surface of a wafer itself (exposed surface)", or a case meaning "the surface of a wafer itself (exposed surface)", or "the surface of a prescribed layer or film, etc., formed on the wafer, that is, an outermost surface of the wafer as a lamination body".

Accordingly, description of "a prescribed gas is supplied to a wafer" in this specification, means a case that "a prescribed gas is directly supplied to the surface (exposed surface) of a wafer itself", or a case that "a prescribed gas is supplied to a layer or a film formed on the wafer, that is, an outermost surface of the wafer as a lamination body". Also, description of "a prescribed layer (or film) is formed on the wafer", means a case that "a prescribed layer (or film) is directly formed on the surface (exposed surface) of the wafer itself", or a case that "a prescribed layer (or film) is formed on the outermost surface of the wafer as a lamination body".

The same thing can be said for using "a substrate" in this specification, and in this case, the "wafer" may be replaced with "substrate" in the above explanation.

(Wafer Charge and Boat Loading)

When a plurality of wafers 200 are charged into the boat 217 (wafer charge), as shown in FIG. 1, the boat 217 supporting the plurality of wafers 200, is lifted by the boat elevator 115, and is loaded into the process chamber 201 (boat load). In this state, the seal cap 219 is set in a state of sealing the lower end of the reaction tube 203 through the O-ring 220.

(Pressure Adjustment and Temperature Adjustment)

The inside of the process chamber 201 is vacuum-exhausted by the vacuum pump 246 so that the inside of the process chamber 201 is set in a desired pressure (vacuum degree). At this time, the pressure in the process chamber 201 is measured by the pressure sensor 245, and based on the measured pressure information, the APC valve 244 is feedback-controlled (pressure adjustment). At this time, for example, valves 243c and 243d are opened, and the APC valve 244 may be fully-opened while supplying N2 gas into the process chamber 201 from the gas supply pipes 232c and 232d. That is, pressure adjustment may be applied to the inside of the process chamber 201 by supplying a prescribed amount of N₂ gas, while simply fully-opening the APC valve 244 without feedback-control. The vacuum pump 246 is maintained in a continuously operated state at least until the end of the processing to the wafer 200.

Further, the inside of the process chamber 201 is heated by the heater 207 so as to be a desired temperature. At this time, the power supply condition to the heater 207 is feedback-controlled based on the temperature information detected by the temperature sensor 263 (temperature adjustment). Heating the inside of the process chamber 201 by the heater 207 is continuously performed at least until the end of the processing to the wafer 200. However, the inside of the process chamber 201 is not required to be heated by the heater 207, when processing is applied to the wafer 200 at a room temperature.

Subsequently, rotation of the boat 217 and the wafer 200 is started by the rotation mechanism 267. The rotation of the boat 217 and the wafer 200 by the rotation mechanism 267 is continuously performed at least until the end of the processing to the wafer 200.

(SiO Film Forming Step)

Thereafter, the following two steps, that is, steps 1 and 2 are sequentially executed.

[Step 1]

In step 1, BTBAS gas is supplied into the process chamber 201 in a state of substantially stopping the exhaust of the inside of the process chamber 201. Thereafter, BTBAS gas is supplied to the wafer 200 by supplying N₂ gas (supplying N₂ gas for dispersion) into the process chamber 201 as the inert gas. Further, exhaust of the BTBAS gas remained in the process chamber 201, is performed (removal of the residual gas).

(Supply of the BTBAS Gas)

BTBAS gas is flowed through the gas supply pipe 232a by opening the valve 243a. BTBAS gas is supplied into the process chamber 201 from the gas supply hole 250a, with its flow rate adjusted by MFC 241a. At this time, BIBAS gas is supplied to the wafer 200 (supply of the BTBAS gas).

At this time, in order to prevent an invasion of the BTBAS gas into the buffer chamber 237 and the nozzle 249b, the valve 243d is opened, to flow the N₂ gas into the gas supply pipe 232d. The N₂ gas is supplied into the process chamber 201 through the gas supply pipe 232b, the nozzle 249b, and the buffer chamber 237.

At this time, exhaust of the process chamber 201 is set in a substantially stopped state, by substantially closing the APC valve 244 as an exhaust valve. The term "substantially" includes the following state. That is, it includes a state that exhaust of the process chamber 201 is stopped by fully-closing the APC valve. It also includes a state that the process chamber 201 is slightly exhausted by slightly opening the APC valve. Here, when the process chamber 201 is slightly exhausted by slightly opening the APC valve, it is preferable to set an exhaust amount (exhaust rate) V (sccm) per unit time in the process chamber 201 in a considerably small state, compared with a supply amount (exhaust rate) $F_B$ (sccm) of the BTBAS gas per unit time, so as to be $F_E \gg V$. Further, for the reason described later, it is more preferable to fully-open the APC valve 244 and stop the exhaust of the process chamber 201, rather than a case that the process chamber 201 is slightly exhausted.

In this embodiment, the BTBAS gas is supplied in a state that the APC valve 244 is fully-opened, and the exhaust of the process chamber 201 is stopped. That is, the pressure in the process chamber 201 is adjusted by supplying a prescribed amount of BTBAS gas by simply fully-closing the APC valve 244 without feedback-control. Thus, BTBAS gas is enclosed in the process chamber 201 by setting the exhaust of the process chamber 201 in a stopped state. Further, the pressure (true pressure) in the process chamber 201 is increased to a prescribed setting pressure, while supply of the BTBAS gas is continued, thus creating a state in which the inside of the process chamber 201 is filled with the BTBAS GAS so that adsorption of the BTBAS gas on the wafer 200 can be further promoted.

Thus, by supplying the BTBAS gas to the wafer 200, formation of the Si-containing layer having a thickness of less than 1 atomic layer to about several atomic layers, is started on the wafer 200 (base film on the surface) as a first layer. The Si-containing layer may be Si layer or may be an adsorption layer of the BTBAS gas, or may contain both of them.

Si layer is generically called a layer including a continuous layer made of Si, a discontinuous layer, or Si thin film formed by superimposition of these layers. The continuous layer made of Si is called the Si thin film in some cases. Si constituting the Si layer includes the one not completely cut from a bond with amino-group (including the one in which alkyl-group is bonded to amino-group), or include the one not completely cut from the bond with hydrogen (H).

The adsorption layer of the BTBAS gas includes a discontinuous adsorption layer other than a continuous adsorption layer of gas molecules of the BTBAS gas. That is, the adsorption layer of the BTBAS gas includes the adsorption layer made of BTBAS molecules and having a thickness of one molecular layer. BTBAS molecules constituting the adsorption layer of the BTBAS gas include the one in which the bond of Si and amino-group is partially cut, or the one in which the bond of Si and H is partially cut. That is, the adsorption layer of the BTBAS gas may be a physical adsorption layer of the BTBAS gas, or may be a chemical adsorption layer of the BTBAS gas, or may include both of them.

Here, the layer having a thickness of less than one atomic layer means an atomic layer formed discontinuously, and the layer having a thickness of one atomic layer means an atomic layer formed continuously. The layer having a thickness of less than one atomic layer means a molecular layer formed discontinuously, and the layer having a thickness of one atomic layer means a molecular layer formed continuously. The Si-containing layer can contain both of the Si layer and the adsorption layer of the BTBAS gas. However, as described above, regarding the Si-containing layer, expressions such as "one atomic layer" and "several atomic layers" are used.

Si layer is formed by deposition of Si on the wafer 200, under a condition that the BTBAS gas is self-decomposed (thermal decomposition), that is, under a condition that a thermal decomposition reaction of BTBAS occurs. The adsorption layer of BTBAS gas is formed by adsorption of the BTBAS gas on the wafer 200, under a condition that the BTBAS gas is not self-decomposed (thermal decomposition), that is, under a condition that the thermal decomposition reaction of the BTBAS gas does not occur. It is more preferable to form the Si layer on the wafer 200, rather than forming the adsorption layer of the BTBAS gas on the wafer 200, because a deposition rate, that is, a film formation rate can be high.

If the thickness of the Si-containing layer formed on the wafer 200 exceeds several atomic layers, a reforming action in step 2 described later, does not reach the whole body of the Si-containing layer. Further, a minimum value of the thickness of the Si-containing layer that can be formed on the wafer 200, is less than one atomic layer. Therefore, the thickness of the Si-containing layer is preferably set to less than one atomic layer to several atomic layers. By setting the thickness of the Si-containing layer to one atomic layer or less, that is, one atomic layer or less than one atomic layer, the action of a reforming reaction in step 2 described later, can be high, and the time required for the reforming reaction in step 2 can be shortened. The time required for forming the Si-containing layer in step 1 can also be shortened. As a result, the time required for a processing time per one cycle can be shortened, and the processing time in total can also be shortened. That is, the deposition rate can also be high. Also, by setting the thickness of the Si-containing layer to one atomic layer or less, controllability of the uniformity in film thickness can be enhanced.

Incidentally, if the BIBAS gas is supplied into the process chamber 201 as described above, concentration of the BTBAS gas in the process chamber 201 is varied in some cases. As a factor of the variation of the concentration of the BTBAS gas in the process chamber 201, for example, a difference of the supply time to each wafer 200 in the process chamber 201, that is, a difference of the time (route) required for reaching the wafer 200 from supply into the nozzle 249a, may be one of the causes. Such a difference of the supply time is generated from the difference of a supply start position of the BTBAS gas in the process chamber 201. Specifically, the difference of supply time is generated because a prescribed time is required for the BTBAS gas to reach the gas supply hole 250a of an uppermost end of the nozzle 249a from the gas supply hole 250a of a lowermost end of the nozzle 249a as a starting point, and eject from the uppermost gas supply hole 250a.

Further, due to such a difference of the supply time or supply route of the BTBAS gas, the following phenomenon would be generated. That is, the BTBAS gas is the gas easily adsorbed on the wafer 200, etc., and having high reactivity. In the process of passing through the nozzle 249 from an upstream side to a downstream side through the nozzle 249a, that is, from a lower part to an upper part through the nozzle 249a at the time of supplying the BTBAS gas into the process chamber 201, the BTBAS gas is adsorbed on an inner wall, etc., of the nozzle 249a, and the BTBAS gas is partially consumed in the middle. In this case, an amount of the BTBAS gas ejected from the upper gas supply hole of the nozzle 249a is smaller than an amount of the BTBAS gas ejected from the lower gas supply hole 250b of the nozzle 249a. Therefore, only a smaller amount of BTBAS gas is supplied to the wafer 200 positioned in the upper part, compared with the wafer 200 positioned in the lower part, in the wafers arranged in multiple stages in a horizontal posture vertically by the boat 21. Thus, the supply amount of the BTBAS gas to each wafer 200 is locally different in some cases, due to long/short of the route of the BTBAS gas to reach each wafer 200 arranged in the process chamber 201, that is, long/short of a required time for the BTBAS gas to reach each wafer 200. Thus, various factors can be considered regarding the variation of the concentration of the BTBAS gas in the process chamber 201.

If the local difference is generated in the supply amount of the BTBAS gas, difference is generated in a formation speed of the Si-containing layer on each wafer 200, that is, difference is generated in the film deposition rate. Therefore, the thickness becomes different in the Si-containing layer formed on each wafer 200. Further, when reforming (oxidizing) the Si-containing layer described later, there is a possibility that difference is generated in a reforming state, that is, difference is generated in an oxidation state. Therefore, the film thickness or quality of the finally formed SiO film is non-uniform among wafers 200.

Therefore, in this embodiment, uniform concentration of the BTBAS gas in the process chamber 201 is achieved by supplying $N_2$ gas for dispersion as described below.

(Supply of $N_2$ Gas for Dispersion)

After supply of the BTBAS gas for a prescribed time or by a prescribed amount, the valve 243c is opened, to flow the $N_2$ gas through the gas supply pipe 232c. The $N_2$ gas flows through the gas supply pipe 232a, with its flow rate adjusted by the MFC 241c, and is supplied into the process chamber 201 from the gas supply hole 250a (supply of the $N_2$ gas for dispersion). At this time, exhaust of the process chamber 201 and supply of the BTBAS gas are set in a substantially stopped state. However, supply of the $N_2$ gas from the gas supply pipe 232d is continued.

Specifically, at this time, the APC valve 244 which is an exhaust valve, is set in a substantially closed state, and the exhaust of the process chamber 201 is set in a substantially stopped state. "Substantially" includes the following state. Specifically, the APC valve 244 is fully-closed, and the exhaust of the process chamber 201 is stopped. The following state is also included. That is, the APC valve is slightly opened, and the process chamber 201 is slightly exhausted. Here, when the APC valve 244 is slightly opened and the process chamber 201 is slightly exhausted, the following state is preferable: that is, the exhaust amount V (sccm) of the inside of the process chamber 201 per unit time (exhausts rate) is considerably smaller than the supply amount $F_N$ (sccm) of the $N_2$ gas per unit time (supply rate), so as to satisfy $F_N \gg V$.

Further, the "substantially stopped state of supplying the BTBAS gas" includes the following case. That is, the valve 243a is closed to stop the supply of the BTBAS gas into the process chamber 201. Moreover, the following case is also included: that is, the flow rate is adjusted by the MFC 241a so that the supply amount of the BTBAS gas is small, and the BTBAS gas is slightly supplied into the process chamber 201. Here, when the BTBAS gas is slightly supplied, the following state is preferable: that is, the supply amount $F_O$ (sccm) of the BTBAS gas per unit time (supply rate) at the time of supplying the $N_2$ gas (supply rate) is considerably smaller than the supply amount $F_B$(sccm) of the BTBAS gas per unit time (supply rate) at the time of supplying the BTBAS gas described above, so as to satisfy $F_B \gg F_O$.

Further, for the reason described later, it is more preferable that the APC valve 244 is fully-closed, to set in a state that exhaust of the process chamber 201 is stopped, rather than a slightly exhaust state in the process chamber 201. Also, it is more preferable that supply of the BTBAS gas is stopped, rather than a slightly supply state of the BTBAS gas.

In this embodiment, the APC valve is fully-closed, and supply of the $N_2$ gas for dispersion is performed in a state that exhaust of the process chamber 201 is stopped. That is, the APC valve is simply fully-closed without feedback control, and the pressure in the process chamber 201 is adjusted by supplying the prescribed amount of $N_2$ gas. Further, at this time, supply of the BTBAS gas into the process chamber 201 is stopped. Even if supply of the BTBAS gas is stopped, the BTBAS gas supplied heretofore can be in a state that it is enclosed in the process chamber 201 by maintaining a stopped state of exhaust of the process chamber 201. Further, the pressure (real pressure) in the process chamber 201 is more increased to a prescribed setting pressure, while supply of the $N_2$ gas is continued.

During supply of the BTBAS gas and N₂ gas, the setting pressure in the process chamber 201 is set to for example 1 to 13300 Pa, preferably in a range of 20 to 1330 Pa, and for example 533 Pa (4 Torr) or less. As described above, an actual pressure in the process chamber 201 is increased to the setting pressure by supplying BTBAS gas or N₂ gas in a state that exhaust of the process chamber 201 is stopped. The supply flow rate (supply rate) of the BTBAS gas controlled by MFC 241a is the flow rate in a range of 1 to 2000 sccm for example, and set to 150 sccm for example. A total supply flow rate of the N₂ gas controlled by MFCs 241c and 241d is 100 to 10000 sccm for example, and preferably in a range of 250 to 350 sccm. The time for supplying BTBAS gas and N₂ gas to the wafer 200, that is, a gas supply time (irradiation time) is set in a range of 1 to 100 seconds, preferably 2 to 30 seconds, and more preferably 2 to 10 seconds respectively. At this time, when a prescribed amount of BTBAS gas is supplied for a prescribed time, BTBAS gas may be switched to N₂ gas, and the supply time of the BTBAS gas can be set to 2 seconds for example, and the supply time of the N₂ gas can be set to 5 seconds for example.

At this time, the temperature of the heater 207 is set to a temperature in a range of a room temperature or more and 200° C. or less, preferably the room temperature or more and 150° C. or less, and more preferably the room temperature or more and 100° C. or less. BTBAS gas is the gas easily adsorbed on the wafer 200, etc., and having high reactivity. Therefore, for example even in a case of a low temperature such as a room temperature of 40° C. or less, BTBAS gas can be chemically adsorbed on the wafer 200, and a practical deposition rate can be obtained. As described in this embodiment, by setting the temperature of the wafer 200 to 200° C. or less, further 150° C. or less, and still further 100° C. or less, quantity of heat added on the wafer 200 can be reduced, and a heat history received by the wafer 200 can be satisfactorily controlled. Also, if the temperature is the room temperature or more, BTBAS gas can be sufficiently adsorbed on the wafer 200, and a sufficient deposition rate can be obtained. Therefore, the temperature of the wafer 200 is set to the room temperature or more and 200° C. or less, preferably the room temperature or more and 150° C. or less, and more preferably the room temperature or more an 100° C. or less.

As described above, even if supply of the BTBAS gas is continued into the process chamber 201 in the state that exhaust of the process chamber 201 is stopped, BTBAS gas is not uniformly spread in the process chamber 201 in some cases. That is, the variation of the concentration of the BTBAS gas in the process chamber 201, that is, the difference of the local supply amount of the BTBAS gas between the upper part and the lower part of the process chamber 201, is not solved in some cases.

Therefore, in this embodiment, as described above, N₂ gas for dispersion is supplied into the process chamber 201 in a state that BTBAS gas is not newly supplied, that is, in a state that the variation of the concentration is hardly generated. Thus, dispersion of the BTBAS gas in the process chamber 201 can be accelerated. That is, by supplying the N₂ gas for dispersion into the process chamber 201 in the state that exhaust of the process chamber 201 is stopped, the process chamber 201 is set in a high pressure state filled with still more gases. At this time, N₂ gas for dispersion acts as a carrier gas for dispersing the BTBAS gas in the process chamber 201. Further, from a viewpoint of a movement in a prescribed direction, N₂ gas for dispersion acts as a piston for pushing-up the BTBAS gas from the lower part to the upper part of the process chamber 201. Owing to these actions, BTBAS gas can be spread uniformly in the process chamber 201, before remarkable variation is generated in the concentration of the BTBAS gas in the process chamber 201. That is, the variation of the concentration generated initially in step 1 by supplying the BTBAS gas, can be reduced to realize a more uniform concentration of the BTBAS gas in the process chamber 201.

Further, in this embodiment, exhaust of the process chamber 201 and supply of the BTBAS gas are stopped. Thus, the flow of the BTBAS gas from a supply side directly to an exhaust side, can be stopped. Such a flow in the process chamber 201 sometimes inhibits the dispersion of the BTBAS gas upward in the process chamber 201. By not creating such a flow of the BTBAS gas, a so-called saturation state of the dispersion of the BTBAs gas (simply called a saturation state hereafter), can be created in the process chamber 201. Then, BTBAS gas can be sufficiently dispersed upward in the process chamber 201, and the inside state of the process chamber 201 can reach a more uniform dispersion state of the BTBAS gas. That is, the inside state of the process chamber 201 after supply of the BTBAS gas can reach in a short time, to the uniform dispersion state of the BTBAS gas extending from the lower part to the upper part of the process chamber 201. Since exhaust of the process chamber 201 is stopped, BTBAS gas does not exhausted from the process chamber 201 in the middle of step 1, by supplying the BTBAS gas initially in step 1, by an amount required for creating the abovementioned saturation state. Therefore, there is no necessity for continuing supply of the BTBAS gas for maintaining the abovementioned saturation state. Thereafter, by maintaining the abovementioned saturation state for a prescribed time, a reaction time required for adsorption of the BTBAS gas on the wafer 200, that is, a reaction time required for forming the Si-containing layer on the wafer 200, can be secured.

When N₂ gas is supplied into the process chamber 201 for 5 seconds in a state that BTBAS gas is supplied into the process chamber 201 for 2 seconds in a state that exhaust of the process chamber 201 is stopped, and thereafter N₂ gas is supplied into the process chamber 201 for 5 seconds in a state that exhaust of the process chamber 201 and supply of the BTBAS gas into the process chamber 201 are respectively stopped, variation of the concentration of the BTBAS gas in the process chamber 201 can be suppressed and the BTBAS gas can be uniformly dispersed to the process chamber 201, compared with a case that BTBAS gas is supplied into the process chamber 201 for a prescribed time, for example for 7 seconds in a state that exhaust of the process chamber 201 is stopped. Namely, variation of the concentration of the BTBAS gas in the process chamber 201 can be suppressed, and the BTBAS gas can be uniformly dispersed in the process chamber 201, by performing two stages of enclosing the BTBAS gas, even if the time for enclosing the BTBAS gas is the same. As a result, uniformity (inter-plane uniformity) of the film thickness and film quality of the SiO film among wafers 200, can be improved.

At this time, in order to make the BTBAS gas spread in the process chamber 201 by N₂ gas, the pressure in the process chamber 201 is preferably maintained to be high as much as possible. However, in this embodiment, as described above, the setting pressure in the process chamber 201 is 533 Pa or less for example. Thus, by suppressing the pressure in the process chamber 201 to a prescribed value or less, removal of the residual gas performed subsequently, can be speedily performed, and reduction of the deposition rate can be prevented, and throughput of the deposition processing can be maintained.

Also, by performing two stages of enclosing the BTBAS gas, an amount of the BTBAS gas exhausted without contributing to the formation of the Si-containing layer can be reduced, compared with a case that the removal of the residual gas is performed immediately after stop of the supply of the BTBAS gas. Therefore, the use amount of the BTBAS gas can be reduced.

The concentration of the BTBAS gas in the process chamber 201 can be made uniform not only in a vertical direction, but also in a horizontal direction. Namely, by supplying the $N_2$ gas for dispersion, BTBAS gas can be pushed into a space sandwiched by the wafers 200 arranged in multiple stages, from an annular space between the inner wall of the reaction tube 203 and the wafers 200. That is, by supplying the $N_2$ gas for dispersion, BTBAS gas can be moved in the vicinity of the center of the wafers 200 from the vicinity of an outer periphery of the wafers 200. Thus, the uniformity (in-plane uniformity) of the film thickness and the film quality of the SiO film can be improved not only among wafers 200, but also in plane of the wafers 200.

The abovementioned "uniformly spread state of the BTBAS gas in the process chamber 201" does not necessarily indicate the following state only: that is, BTBAS gas is completely dispersed in the process chamber 201, which is the state that variation of the concentration of the BTBAS gas in the process chamber 201 is zero. For example, if a concentration distribution of the BTBAS gas in the process chamber 201 during supply of the $N_2$ gas for dispersion, is more uniform than at least the concentration distribution of the BTBAS gas in the process chamber 201 during supply of the BTBAS gas, the abovementioned action effect can be obtained. Also, the abovementioned action effect can be obtained, if the concentration distribution of the BTBAS gas in the process chamber 201 during supply of the $N_2$ gas for dispersion, is more uniform than at least the concentration distribution of the BRBAS gas in the process chamber 201 when supply of the BTBAS gas is continued without performing supply of the $N_2$ gas for dispersion.

(Removal of the Residual Gas)

After supply of the prescribed amount of $N_2$ gas for dispersion for a prescribed time, the APC valve 244 is fully-opened for example, and the process chamber 201 is vacuum-exhausted by the vacuum pump 246, to thereby exclude the BTBAS gas unreacted and remained in the process chamber 201 or after contributing to the formation of the Si-containing layer, from the process chamber 201 (removal of the residual gas). However, if a sufficient exhaust amount can be obtained, the APC valve 244 is not required to be fully-opened. At this time, supply of the $N_2$ gas which is the inert gas, into the process chamber 201 is maintained, with valves 243c and 243d fully-opened. $N_2$ gas actions as a purge gas, thus making it possible to obtain a high effect of excluding the BTBAS gas after contributing to the formation of the Si-containing layer, from the process chamber 201.

At this time, the gas remained in the process chamber 201 is not required to be completely excluded, and the process chamber 201 is not required to be completely purged. If the gas remained in the process chamber 201 is small, there is no adverse influence in step 2 performed thereafter. The flow rate of the $N_2$ gas supplied into the process chamber 201 is not required to be large, and by supplying the $N_2$ gas with an amount equivalent to a volume of the reaction tube 203 (process chamber 201), purge can be performed in step 2 so as not to generate the adverse influence. Thus, by not completely purging the process chamber 201, a purging time can be shortened, and a throughput can be improved. Further, consumption of the $N_2$ gas can be suppressed to minimum.

As the aminosilane-based source gas, organic silane-based source gas such as aminosilane-based source gas, tetrakis dimethyl amino silane ($Si[N(CH_3)_2]_4$ abbreviation: 4DMAS) gas, trisdimethylaminosilane ($Si[N(CH_3)_2]_3H$, abbreviation: 3DMAS) gas, and bis diethylaminosilane ($Si[N(C_2H_5)_2]_2H_2$ abbreviation: 2DEAS), may be used other than BTBAS gas. As the inert gas, rare gas such as Ar gas, He gas, Ne GAS, AND Xe gas, etc., may be used other than $N_2$ gas.

[Step 2]

(Supply of $O_2$ Gas)

When step 1 is ended and after the residual gas in the process chamber is removed, the valve 243b is opened, to flow $O_2$ gas into the gas supply pipe 232b. $O_2$ gas is supplied into the buffer chamber 237 from the gas supply holes 250b, with the flow rate adjusted by MFC 241b. At this time, $O_2$ gas supplied into the buffer chamber 237 is plasma-excited by applying high frequency power between rod electrodes 269 and 270 via a matching box 272, and is supplied into the process chamber 201 from the gas supply holes 250c as active species, then exhausted from the exhaust pipe 231. At this time, $O_2$ gas activated (excited) by plasma is supplied to the wafer 200.

At this time, in order to prevent invasion of the $O_2$ gas into the nozzle 249a, the valve 243c is opened, to flow $N_2$ gas into the gas supply pipe 232c. $N_2$ gas is supplied into the process chamber 201 via the gas supply pipe 232a and the nozzle 249a, and is exhausted from the exhaust pipe 231.

At this time, the APC valve is properly adjusted, to set the pressure in the process chamber 201 in a range of 1 to 100 pa, and for example set to 1 Pa. Here, the APC valve 244 is fully-opened for example. That is, the APC valve 244 is simply fully-opened without feedback control, and a prescribed amount of prescribed gas is supplied, to thereby control the pressure in the process chamber 201 to 1 Pa for example. The supply amount of the $O_2$ gas controlled by MFC 241b is set for example in a range of 100 to 10000 sccm, and preferably 3000 to 4000 sccm.

The supply flow rate of the $N_2$ gas controlled by MFC 241c is for example set in a range of 100 to 10000 sccm, and set to 100 sccm for example. The time for supplying the $O_2$ gas to the wafer 200, that is, a gas supply time (irradiation time) is set in a range of 1 to 120 seconds, and preferably in a range of 1 to 60 seconds. The temperature of the heater 207 is set so that the temperature of the wafer 200 is set in a similar temperature zone as the temperature zone during supply of the BTBAS gas in step 1, that is, set in a range of a room temperature or more and 200° C. or less, preferably a room temperature or more and 150° C. or less, and more preferably a room temperature or more and 100° C. or less. By using plasma, $O_2$ gas can be activated, even if the temperature of the process chamber 201 is set as a relative low temperature zone. The high frequency power applied between rod electrodes 269 and 270 from the high frequency power source 273, is set in a range of 50 to 1000 W for example.

The gas flowed into the process chamber 201 is the $O_2$ gas excited by plasma, and contains active species such as oxygen radial ($O_2^*$), etc. Further, BTBAS gas is not flowed into the process chamber 201. Accordingly, $O_2$ gas is supplied to the wafer 200 in an activated state without causing a vapor phase reaction, and mainly by this active species, oxidation treatment is applied to the Si-containing layer formed on the wafer 200 in step 1. Since an energy of this active species is higher than a bonding energy of Si—N bond and Si—H bond contained in the Si-containing layer, Si—N bond and Si—H bond contained in the Si-containing layer is cut off from each other, by giving the energy of this active species to the Si-containing layer. C bonded with N, H, and N which are cut off from the bond with Si, is removed from the Si-containing layer, and is discharged as $N_2$, $H_2$, and $CO_2$, etc. Further, an extra bonding hand of Si as a result of cutting-off the bonds from N, H, is bonded to O contained in the reactive species, thus forming Si—O bond. Thus, the Si-containing layer is changed (reformed) to a silicon oxide layer (SiO layer).

(Removal of the Residual Gas)

Thereafter, supply of the high frequency power between rod electrodes 269 and 270 is stopped. Further, the valve 243b is closed, to stop supply of the $O_2$ gas into the process chamber 201. At this time, the APC valve of the exhaust pipe 231 is fully-opened for example, and the process chamber 201 is vacuum-exhausted by the vacuum pump 246, to thereby exclude the $O_2$ gas unreacted or after contributing to a reaction and a reaction byproduct remained in the process chamber 201 (Removal of the residual gas). However, the APC valve 244 is not required to be fully-opened, if a sufficient exhaust amount can be obtained. At this time, the valve 243d is further opened, with the valve 243c closed, to thereby maintain supply of the $N_2$ gas into the process chamber 201 as the inert gas. $N_2$ gas actions as a purge gas, thus enhancing the effect of excluding from the process chamber 201, the $O_2$ gas unreacted or after contributing to a reaction and a reaction byproduct remained in the process chamber 201.

At this time, the gas remained in the process chamber 201 is not required to be completely excluded, and the process chamber 201 is not required to be completely purged. If the gas remained in the process chamber is small, there is no adverse influence in step 1 performed thereafter. At this time, the flow rate of the $N_2$ gas supplied into the process chamber 201 is not required to be large, and by supplying the $N_2$ gas with an amount equivalent to a volume of the reaction tube 203 (process chamber 201), purge can be performed in step 1 so as not to generate the adverse influence. Thus, by not completely purging the process chamber 201, a purging time can be shortened, and a throughput can be improved. Further, consumption of the $N_2$ gas can be suppressed to minimum.

FIG. 5 shows a standard flow rate of the $N_2$ gas in each step, by a height of a drawn line (the flow rate of the $N_2$ gas in the figure is as follows: during removal of the residual gas>during supply of the $N_2$ gas for dispersion>during supply of the BTBAS gas>during supply of the $O_2$ gas). Thus, by more increasing the flow rate of the $N_2$ gas during supply of the $N_2$ gas for dispersion, than the flow rate of the $N_2$ gas during supply of the BTBAS gas), reduction of an overall gas flow rate due to stop of supply of the BTBAS gas, can be supplemented, and a dispersion speed of the BTBAS gas in the process chamber 201 by $N_2$ gas can be more increased. Therefore, BTBAS gas can be uniformly spread in the process chamber 201 in further shorter time. Namely, a uniformly dispersion state of the BTBAS gas can be set, from the lower part to the upper part of the process chamber 201 in further shorter time. Also, a pressure variation, etc., in the process chamber 201 due to a rapid change of the overall gas flow rate can be suppressed, and a pressure rise can be stably achieved. However, each flow rate or its large/small relation of the $N_2$ gas is absolutely an example, and the present invention is not limited thereto.

Also, FIG. 5 shows the setting pressure in the process chamber 201 in each step, by the height of the drawn line (the setting pressure in the figure is as follows: during supply of the BTBAS gas≈during supply of the $N_2$ gas for dispersion>during supply of the $O_2$ gas during removal of the residual gas). Thus, the pressure in the process chamber 201 at least during supply of the BTBAS gas to the wafer 200, that is, during supply of the BTBAS gas and during supply of the $N_2$ gas for dispersion, is maintained in a higher pressure state than the pressure in the process chamber 201 during supply of the $O_2$ gas and during removal of the residual gas. That is, a high pressure enclosing state of the BTBAS gas in the process chamber 201 can be more surely maintained. However, each setting pressure and its large/small relation are absolutely an example, and the present invention is not limited thereto.

As an oxygen-containing gas, that is, as an oxidation gas, ozone ($O_3$) gas or vapor ($H_2O$ gas), etc., may be used other than the $O_2$ gas. A nitrogen monoxide (NO) gas or a nitrous oxide ($N_2O$) gas, etc., may also be used. As the inert gas, rare gases such as Ar gas, He gas, Ne gas, and Xe gas, etc., may be used, other than $N_2$ gas.

(Execution of Prescribed Number of Times)

SiO film having a prescribed composition and prescribed film thickness can be formed on the wafer 200 by setting the abovementioned steps 1 and 2 as one cycle, and per forming this cycle once or more (prescribed number of times). The abovementioned cycle is preferably repeated multiple numbers of times. That is, it is preferable that the thickness of the SiO film formed per one cycle is set to be smaller than a desired film thickness, and the abovementioned cycle is repeated multiple numbers of times until the desired film thickness is obtained.

At this time, by controlling processing conditions such as the pressure in the process chamber 201 and the gas supply time in each step, each element component in the SiO layer, that is, the ratio of Si component and component, that is, Si concentration and O concentration can be adjusted, and the composition ratio of the SiO film can be controlled.

When the cycle is performed multiple numbers of times, and in each step at least after second cycle, the description "a prescribed gas is supplied to the wafer 200", means "a prescribed gas is supplied to a layer formed on the wafer 200, that is, to an uppermost surface of the wafer 200 as a lamination body", and the description "a prescribed layer is formed on the wafer 200" means "a prescribed layer is formed on a layer formed on the wafer 200, that is on the uppermost surface of the wafer 200 as a lamination body". This point is described above. The same thing can be said for a modified example, etc., described later.

(Purge and Return to Atmospheric Pressure)

When performing such a film formation processing of forming the SiO film having a prescribed composition and a prescribed film thickness, valves 243c and 243d are opened, and $N_2$ gas as the inert gas is supplied into the process chamber 201, to thereby exhaust the process chamber 201 from the exhaust pipe 231. $N_2$ gas actions as a purge gas, thus purging the process chamber 201 by the inert gas, and the gas and the reaction byproduct remained in the process chamber 201 is removed from the process chamber 201 (purge). Thereafter, atmosphere in the process chamber 201 is replaced with the inert gas (replacement with inert gas), and the pressure in the process chamber 201 is returned to a normal pressure (return to atmospheric pressure).

(Boat Unload and Wafer Discharge)

Thereafter, the seal cap 219 is descended by the boat elevator 115, and the lower end of the reaction tube 203 is opened, so that the processed wafer 200 is unloaded to the outside of the reaction tube 203 from the lower end of the reaction tube 203 in a state of being supported by the boat 217. Thereafter, the processed wafer 200 is discharged by the boat 217 (wafer discharge).

(3) Effect Obtained by this Embodiment

According to this embodiment, one or a plurality of effects are exhibited as follows.
(a) BTBAS gas is supplied to the wafer 200 in the process chamber 201 in a state that exhaust of the process chamber 201 is substantially stopped. Thus, BTBAS gas can be enclosed in the process chamber 201, and adsorption of the BTBAS gas on the wafer 200 can be accelerated. As a result, the deposition rate of the SiO film can be improved. Step coverage of the SiO film can also be improved. The film thickness and the film quality of the SiO film of inter-plane and in-plane of the wafer 200 can also be improved.
(b) $N_2$ gas for dispersion is supplied into the process chamber 201 in a state that exhaust of the process chamber 201 and supply of the BTBAS gas are substantially stopped. $N_2$ gas for dispersion actions as a carrier gas, and also actions as a piston. Owing to these actions, BTBAS gas can be moved in the vicinity of the center of the wafers 200 from the vicinity of an outer periphery of the wafers 200. Namely, BTBAS gas can be moved in the horizontal direction. BTBAS gas can also be moved from the lower part to the upper part in the process chamber 201, that is, in the vertical direction. That is, BTBAS gas can be uniformly spread in the process chamber 201. As a result, the film thickness and the film quality of the SiO film can be uniformly improved inter-plane (vertical direction) and in-plane (horizontal direction) of the wafer 200.

If the SiO film is formed using the BTBAS gas easily adsorbed and having high reactivity, is formed as a source gas, adsorption, etc., of the BTBAS gas easily occurs on a supply route. Therefore, the concentration of the BTBAS gas in the process chamber 201 is varied, and there is a problem that inter-plane or in-plane uniformity is damaged in the film thickness and the film quality of the SiO film formed on the wafer 200.

In order to cope with such a problem, the following method can be considered, that is, the deposition rate of the SiO film is adjusted to be uniform by forming a vertical gradient in the temperature of the process chamber 201 for example, thus reducing the non-uniformity of the film thickness and the film quality of the SiO film between wafers 200. However, as shown in this embodiment, the abovementioned temperature gradient is hardly formed under a condition that the film deposition is performed at a relatively low temperature, thus making it difficult to improve inter-plane and in-plane uniformity.

Therefore, in this embodiment, $N_2$ gas for dispersion is supplied. Thus, such a variation of the concentration can be reduced, and inter-plane uniformity and in-plane uniformity of the film thickness and the film quality of the SIC film formed on the wafer 200 can be improved.
(c) In supplying the BTBAS gas to the wafer 200 in the process chamber 201, enclosure of the BTBAS gas is performed in 2 stages of supplying the BIBAS gas and supplying the $N_2$ gas for dispersion. Thus, BTBAS gas can be sufficiently dispersed in the process chamber 201, and the inside state of the process chamber 201 can be set in a further uniform dispersion state of the BTBAS gas in a short time. Thus, a reaction time required for forming the Si-containing layer on the wafer 200, can be secured. Further, an amount of the BTBAS gas not contributing to the formation of the Si-containing layer and exhausted, can be reduced. As a result, the use amount of the BTBAS gas can be reduced, and a film formation cost can be reduced.
(d) In supplying the BTBAS gas to the wafer 200 in the process chamber 201, the pressure in the process chamber 201 is set to a prescribed pressure or less. Thus, the process chamber 201 can be exhausted in a short time, by removing the residual gas which is the processing performed next. As a result, reduction of the film deposition rate can be prevented, and the throughput of the film deposition processing can be maintained.
(e) When BTBAS gas is supplied to the wafer 200, that is, when BTBAS gas is supplied into the process chamber 201 and $N_2$ gas for dispersion is supplied into the process chamber 201, the process chamber 201 is set in a state that exhaust is stopped. Thus, BTBAS gas can be more surely enclosed, and adsorption of the BTBAS gas on the wafer 200 can be further accelerated. Also, by supplying the BTBAS gas initially in step 1, by an amount required for a single reaction in step 1, BTBAS gas is not exhausted from the process chamber 201, and there is no necessity for continuing the supply of the BTBAS gas. As a result, the use amount of the BTBAS gas can be reduced, and the film formation cost can be reduced.

Further, when $N_2$ gas for dispersion is supplied into the process chamber 201, exhaust of the process chamber 201 and supply of the BTBAS gas are set in a stopped state. Thus, the flow of the BTBAS gas can be stopped in the process chamber 201 from the supply side directly to the exhaust side, and a dispersion saturated state of the BTBAS gas can be created in the process chamber 201. That is, BTBAS gas can be sufficiently dispersed upward in the process chamber 201, and more uniform state can be set in a short time.

Further, when BTBAS gas is supplied into the process chamber 201, and when $N_2$ gas for dispersion is supplied into the process chamber 201, simply, the process chamber 201 is set in an exhaust stopped state. That is, the APC valve 244 is simply fully-closed, and there is no necessity for finely adjusting an opening degree of the APC valve 244 by feedback control. That is, control of the APC valve and the pressure is easy.
(f) When $N_2$ gas for dispersion is supplied into the process chamber 201, supply of the BTBAS gas is stopped. Thus, a new variation is hardly generated in the BTBAS gas in the process chamber 201, and uniform concentration of the BTBAS gas can be realized in a short time in the process chamber 201.
(g) When $N_2$ gas for dispersion is supplied into the process chamber 201, the flow rate of the $N_2$ gas is more increased than the flow rate when supplying the BTBAS gas into the process chamber 201. Thus, the dispersion speed of the BTBAS gas in the process chamber 201 by $N_2$ gas can be more increased, and BTBAS gas can be uniformly spread in the process chamber 201 in a further shorter time. Further, reduction of the overall gas flow rate due to stop of the supply of the BTBAS gas can be suppressed, and the pressure in the process chamber 201 can be stably increased.

(4) Modified Example of this Embodiment

Figure 6:
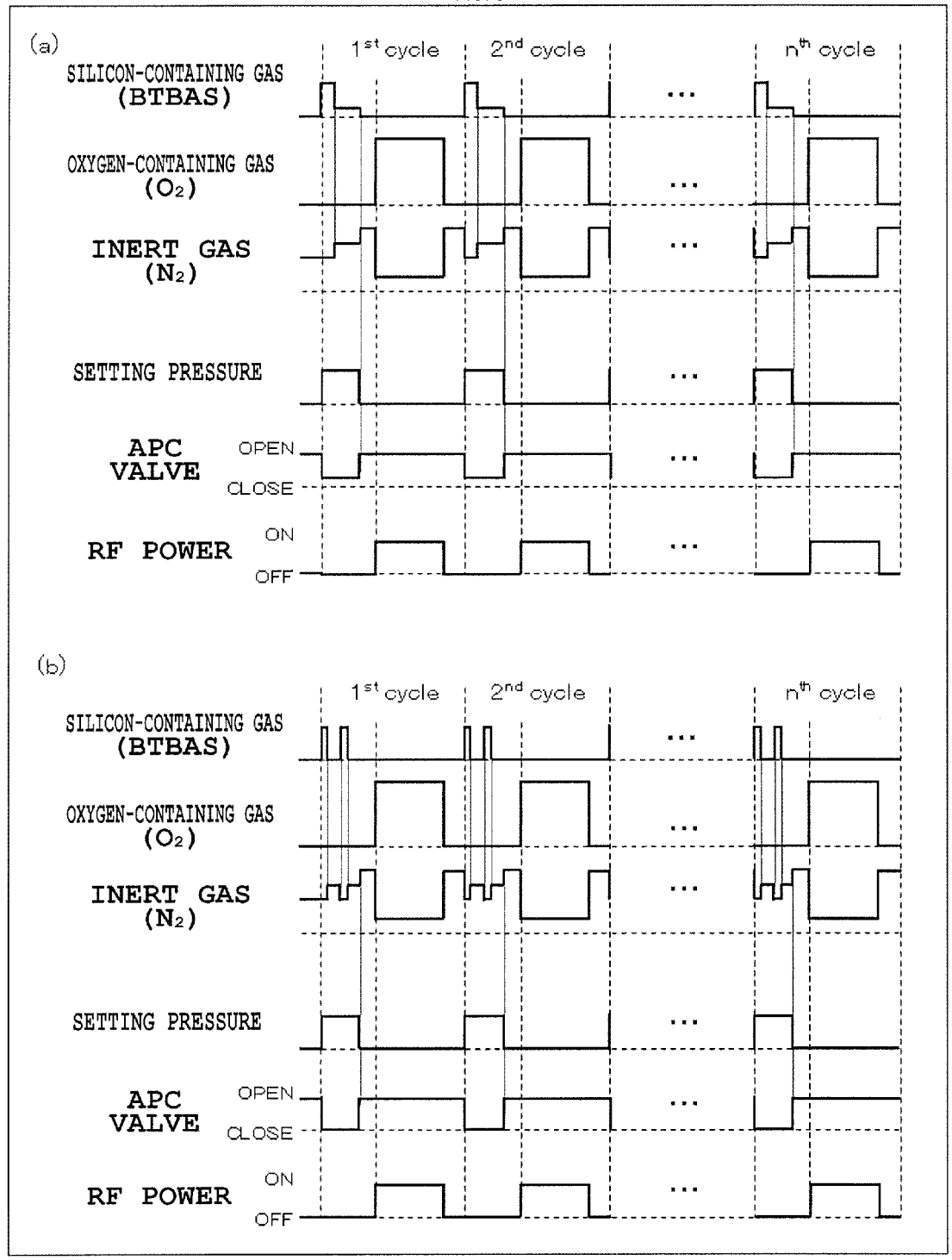
FIG. 6 (a) is a view showing the timing of the gas supply, change of a setting pressure, open/close of the APC valve, and a high frequency power supply, in the film formation sequence according to an embodiment of the present invention, and (b) is a view showing the timing of the gas supply, change of a setting pressure, open/close of the APC valve, and a high frequency power supply in the film formation sequence of a modified example of an embodiment of the present invention.

Modified examples of this embodiment will be described using FIG. 6.
In a film formation sequence of the modified example shown in FIG. 6(a), in supplying the BTBAS gas to the wafer 200 in the process chamber 201, BTBAS gas is supplied into the process chamber 201 in a slightly exhausted state of the process chamber 201, and thereafter the process chamber 201 is slightly exhausted, and $N_2$ gas is supplied into the process chamber 201 in a slightly supplied state of the BTBAS gas. In this case as well, the processing condition can be similar to the film formation sequence shown in FIG. 5 for example.

By setting a slightly exhausted state of the process chamber 201, it becomes easy to suppress a rapid increase of the pressure in the process chamber 201, or maintain the pressure in the process chamber 201 to a prescribed pressure or less. In this case as well, BTBAS gas can be uniformly spread in the process chamber 201 in a short time, and the effect similar to the effect of the film formation sequence shown in FIG. 5 can be obtained.

Further, by setting a slightly supplied state of the BTBAS gas, consumption of the BTBAS gas consumed by the formation, etc., of the Si-containing layer can be supplemented. In this case as well, BTBAS gas can be uniformly spread in a short time in the process chamber 201, and the effect similar to the effect of the film formation sequence of FIG. 5 can be obtained.

However, as shown in the film formation sequence of FIG. 5, by stopping the exhaust of the process chamber 201 and supply of the BTBAS gas, the flow of the BTBAS gas from the supply side directly to the exhaust side can be stopped, and further higher effect can be obtained. In the middle of step 1, useless exhaust of the BTBAS gas from the process chamber 201 can be suppressed. Therefore, the film formation sequence of FIG. 5 is more preferable than the film formation sequence of FIG. 6, in the point that BTBAS gas can be dispersed in the process chamber 201 in a further shorter time and more uniformly, and the use amount of the BTBAS gas can be further reduced.

Further, in the film formation sequence of other modified example shown in FIG. 6(b), in the step corresponding to step 1 of the film formation sequence of FIG. 5, supply of the BTBAS gas and supply of the $N_2$ gas for dispersion are repeated multiple numbers of times, and thereafter a cycle including the step of removing the residual gas and the step corresponding to step 2 of the abovementioned embodiment, is performed for prescribed number of times.

That is, the SiO film is formed on the wafer 200 by performing a cycle a prescribed number of times, the cycle including:

repeating the supply of the BTBAS gas to the wafer 200 in the process chamber 201 for prescribed number of times:

exhausting the BTBAS gas remained in the process chamber 201;

supplying $O_2$ gas to the wafer 200 in the process chamber 201; and exhausting the $O_2$ gas remained in the process chamber 201.

In this case as well, the processing condition can be similar to the processing condition of the film formation sequence shown in FIG. 5 for example.

Here, in supplying the BTBAS gas to the wafer 200, BTBAS gas is supplied into the process chamber 201 in a state that exhaust of the process chamber 201 is substantially stopped, and thereafter $N_2$ gas is supplied into the process chamber 201 in a state that exhaust of the process chamber 201 and supply of the BTBAS gas are substantially stopped.

Thus, by increasing/decreasing the number of times of supplying the BTBAS gas, with respect to supply of the $O_2$ gas, the uniformity of the film thickness and the film quality of the SiO film of inter-plane and in-plane of the wafer 200, can be more precisely controlled.

Controllability of the uniformity of the film thickness and the film quality of the SiO film of inter-plane and in-plane of the wafer 200, can be improved by suitably increasing/decreasing the supply amount of the BTBAS gas, or suitably increasing/decreasing the supply time of the $N_2$ gas for dispersion.

Other Embodiment

As described above, embodiments of the present invention are specifically described. However, the present invention is not limited to the abovementioned embodiments, and can be variously modified in a range not departing from the gist of the invention.

For example, in the abovementioned embodiment, explanation is given for an example of supplying the $N_2$ gas for dispersion from the nozzle 249a that supplies BTBAS gas. However, the present invention is not limited to this embodiment. Namely, $N_2$ gas for dispersion may be supplied from a different line from the line that supplies BTBAS gas. Further, supply of the $N_2$ gas for dispersion may be performed not from a long nozzle like the nozzle 249a, but from a short nozzle having gas supply holes near a lower end of the boat 217 for example. Thus, high effect can be obtained in pushing-up upward the BTBAS gas in the lower part of the process chamber 201.

Further, in the abovementioned embodiment, explanation is given for an example that the nozzle 249a for supplying BTBAS gas has a plurality of gas supply holes 250a with the same opening area and opening pitch. However, the present invention is not limited to this embodiment. That is, the opening area and the opening pitch of each gas supply hole is not required to be the same. For example, the nozzle 249a for supplying BTBAS gas may be formed so that the opening area or the opening pitch of the gas supply hole is larger or the opening pitch of the gas supply hole is smaller from an upstream side to a downstream side of the nozzle. Thus, the supply amount of the BTBAS gas from the downstream side of the nozzle 249a is increased, and the variation of the concentration in the process chamber 201 is more easily relaxed.

Further, in the abovementioned embodiment, explanation is given for an example of supplying the BTBAS gas into the process chamber 201 using the long nozzle like the nozzle 249a. However, the present invention is not limited to this embodiment. That is, a short nozzle can be used for supplying the BTBAS gas. Unlike the long nozzle that can be a guide passage for guiding the BTBAS gas upward in the process chamber 201, BTBAS gas can be uniformly spread in the process chamber 201 according to each film formation sequence shown in FIG. 5 and FIG. 6, even if the BTBAS gas is hardly spread in the upper part of the process chamber 201 by using the short nozzle.

Further, in the abovementioned embodiment, explanation is given for an example of dispersing the BTBAS gas in the processing camber 201 by supplying the $N_2$ gas for dispersion. However, the present invention is not limited to this embodiment. That is, $N_2$ gas for dispersion is not required to be supplied into the process chamber 201. That is, after supply of the BTBAS gas is stopped in the process chamber 201, exhaust of the process chamber 201 is stopped for a prescribed time without supplying the $N_2$ gas for dispersion into the process chamber 201, then the BTBAS gas may be dispersed into the process chamber 201. However, by supplying N₂ gas for dispersion, as described above, dispersion of the BTBAS gas into the process chamber 201 can be accelerated, and in addition, uniform dispersion state of the BTBAS gas can be set from the lower part to the upper part of the process chamber 201, in a further shorter time. Also, by supplying the N₂ gas for dispersion, the effect of pushing-out the BTBAS gas remained in the nozzle 249a or adsorbed thereon for example, can be obtained. Thus, the use amount of the BTBAS gas can be further reduced.

Further, in the film formation sequence of the abovementioned embodiment, explanation is given for an example of simply fully-opening or fully-closing the APC valve 244 without feedback control. In this case, instead of the APC valve as a pressure adjustment part, an open/close valve, etc., may also be used as an exhaust valve having only modes of fully opening/fully closing. Thus, the structure of an exhaust system can be simplified, and a substrate processing apparatus can have a simple structure at a low cost.

Further, in the film formation sequence of the abovementioned embodiment, explanation is given for an example of forming the SiO film at a room temperature. In this case, there is no necessity for heating the process chamber 201 by the heater 207, and there is no necessity for providing the heater 207 in the substrate processing apparatus. Thus, the structure of the substrate processing apparatus can be simplified, and a manufacturing cost of the substrate processing apparatus, that is, a substrate processing cost can be reduced.

Further, in the abovementioned embodiment, explanation is given for an example of using the aminosilane-based source gas. However, the present invention is not limited to this embodiment. That is, chlorosilane-based source gas may also be used as a source gas. As the chlorosilane-based source gas, inorganic source gas such as tetrachlorosilane silicon tetrachloride ($SiCl_4$, abbreviation: STC) gas, trichlorosilane ($SiHCl_3$, abbreviation: TCS) gas, dichlorosilane ($SiH_2Cl_2$, abbreviation: DCS) gas, monochlorosilane ($SiH_3Cl$, abbreviation: MCS), may be used, other than hexachlorodisilane ($Si_2Cl_6$, abbreviation: HODS) gas. Further, silane-based source gas of a halogen-base excluding chlorosilane-base, for example, fluorosilane-based source gas, etc., may also be used as the source gas. As the fluorosilane-based source gas, for example, silicon fluoride gas such as tetrafluorosilane, that is, silicon tetrafluoride ($SiF_4$) gas or hexafluoro disilane ($Si_2F_6$) gas, etc., can be used. When using the gas easily adsorbed and having high reactivity like the aminosilane-based source gas, the chlorosilane-based source gas, and fluorosilane-based source gas, as the source gas, the effect of the present invention is further easily exhibited. In this case, the gas similar to the gas of the abovementioned embodiment can be used as the oxygen-containing gas. The processing condition at this time, can be similar to the processing condition of the abovementioned embodiment for example.

Further, in the abovementioned embodiment, explanation is given for an example of reforming (oxidizing) the Si-containing layer using $O_2$ gas excited by plasma. However, the present invention is not limited to this embodiment. That is, $O_2$ gas may be thermally activated (excited). Also, a catalyst such as pyridine ($C_5H_5N$) gas, etc., may be added to $H_2O$ gas, etc., for example as the oxygen-containing gas. The oxidation reaction by the oxygen-containing gas can be accelerated by the catalyst, without using plasma or heat. Further, the catalyst such as $C_5H_5N$ can be used by not only adding it to a reactive gas (oxygen-containing gas) but also by adding it to a prescribed source gas such as HCDS gas, etc. Namely, the film formation similar to the film formation of the abovementioned embodiment can be performed by using the catalyst such as $C_5H_5N$ gas, etc., to at least one of the source gas and the reactive gas.

Further, in the abovementioned embodiment, explanation is given for an example of forming an oxide film using the oxygen-containing gas such as $O_2$ gas as the reactive gas. However, the present invention is not limited to this embodiment. For example, the SiN film may be formed by nitriding the Si-containing layer using a nitrogen-containing gas as the reactive gas. Further, for example, a carbon-containing gas may be used, to add C in the Si-containing layer as the reactive gas, to thereby form the SiC film. Alternately, the oxygen-containing gas, the nitrogen-containing gas, and the carbon-containing gas may be suitably combined, to form Si-based insulation film such as SiON film, SiOC film, SiCN film, or SiOCN film, etc. As the nitrogen-containing gas, for example, diazene ($N_2H_2$) Gas, hydrazine ($N_2H_4$) gas, $N_3H_8$ gas, and a gas containing a compound of them, can be used, other than ammonia ($NH_3$) gas. As the carbon-containing gas, hydrocarbon gas such as acetylene ($C_2H_2$) gas and ethylene ($C_2H_4$) gas, etc., can be used.

Also, in the abovementioned embodiment, explanation is given for an example of forming the Si-based insulation film containing Si which is a semiconductor element, (SiO film, SiN film, SiC film, SiON film, SiOC film, SiCN film, and SiOCN film, etc.). However, the present invention is not limited to this embodiment. Namely, the present invention can be applied to a case that a metal thin film is formed, containing metal elements such as titanium (Ti), zirconium (Zr), hafnium (Hf), tantalum (Ta), aluminum (Al), and molybdenum (Mo).

In this case, the film formation by a similar sequence as the abovementioned embodiment can be performed, using a metal source gas, instead of the silicon-based source gas of the abovementioned embodiment. That is, a film is formed on the wafer 200 by performing a cycle a prescribed number of times, the cycle including:

supplying the metal source gas to the wafer 200 in the process chamber;

exhausting the metal source gas remained in the process chamber 201;

supplying a reactive gas to the wafer 200 in the process chamber 201; and exhausting the reactive gas remained in the process chamber 201.

In supplying the metal source gas to the wafer 200, the metal source gas is supplied into the process chamber 201 in a state that exhaust of the process chamber 201 is substantially stopped, and thereafter an inert gas is supplied into the process chamber 201 in a state that exhaust of the process chamber 201 and supply of the metal source gas are substantially stopped.

For example, when the metal thin film containing Ti (TiO film, TiN film, TiC film, TiON film, TiOC film TICN film, and TiOCN film, etc.,) is formed, gas containing Ti and amino-groups such as Tetrakis ethyl methyl amino titanium ($Ti[N(C_2H_5)(CH_3)]_4$, abbreviation: TEMAT), tetrakis dimethyl amino titanium ($Ti[N(CH_3)_2]_4$, abbreviation: TDMAT), tetrakisdiethylaminohafnium titanium ($Ti[N(C_2H_5)_2]_4$, abbreviation: TDEAT), or gas containing Ti and chloro-groups such as titanium tetrachloride ($TiCl_4$), or gas containing fluoro-groups such as titanium tetrafluoride ($TiF_4$), can be used as the source gas. Gas similar to the abovementioned gas can be used as the reactive gas (oxygen-containing gas, nitrogen-containing gas, and carbon-containing gas). The processing condition at this time can be similar to the processing condition of the abovementioned embodiment.

Further, for example, when the metal thin film containing Zr (ZrO film, ZrN film, ZrC film, ZrON film, ZrOC film, ZrCN film, ZrOCN film, etc.), gas containing Zr and amino-groups such as Tetrakis ethyl methyl amino zirconium (Zr[N($C_2H_5$)($CH_3$)]$_4$, abbreviation: TEMAZ), tetrakis dimethyl amino zirconium (Zr[N($CH_3$)$_2$]$_4$, abbreviation: TDMAZ) Tetrakisdiethylaminohafnium zirconium (Zr[N($C_2H_5$)$_2$]$_4$, abbreviation: TDEAZ)), or gas containing Zr and chloro-groups such as zirconium tetrachloride ($ZrCl_4$), or gas containing Zr and fluoro-groups such as Zirconium tetrafluoride ($ZrF_4$), can be used as the source gas. The gas similar to the abovementioned gas can be used as the reactive gas (oxygen-containing gas, nitrogen-containing gas, and carbon-containing gas). The processing condition at this time can be similar to the processing condition of the abovementioned embodiment.

Further for example, when the metal thin film containing Hf (HfO film, HfN film, HfC film, HfO film, HfOC film, HfCN film, and HfOCN film, etc.) is formed, gas containing Hf and amino-groups such as Tetrakis ethyl methyl amino hafnium (Hf[N($C_2H_5$)($CH_3$)]$_4$, abbreviation: TEMAH), tetrakis dimethyl amino hafnium (Hf[N($CH_3$)$_2$]$_4$, abbreviation: TDMAH), tetrakisdiethylaminohafnium hafnium (Hf[N($C_2H_5$)$_2$]$_4$, abbreviation: TDEAH), or gas containing Hf and chloro-groups such as hafnium tetrachloride ($HfCl_4$), or gas containing Hf and fluoro-groups such as hafnium tetrafluoride ($HfF_4$), can be used as the source gas. The gas similar to the abovementioned gas can be used as the reactive gas (oxygen-containing gas, nitrogen-containing gas, and carbon-containing gas). The processing condition at this time can be similar to the processing condition of the abovementioned embodiment.

Further for example, when the metal thin film containing Ta (TaO film, TaN film, TaC film, TaON film, TaOC film, TaCN film, TaOCN film, etc.) is formed, gas containing Ta and chloro-groups such as tantalum penta chloride ($TaCl_5$), or gas containing Ta and fluoro-groups such as tantalum penta fluoride ($TaF_5$), can be used as the source gas. The gas similar to the abovementioned gas can be used as the reactive gas (oxygen-containing gas, nitrogen-containing gas, and carbon-containing gas). The processing condition at this time can be similar to the processing condition of the abovementioned embodiment.

Further for example, when the metal thin film containing Al (AlO film, AlN film, AlC film, AlON film, AlOC film, AlCN film, AlOCN film, etc.) is formed, gas containing Al and chloro-groups such as Aluminum trichloride ($AlCl_3$), or gas containing Al and fluoro-groups such as aluminum trifluoride ($AlF_3$), can be used as the source gas. The gas similar to the abovementioned gas can be used as the reactive gas (oxygen-containing gas, nitrogen-containing gas, and carbon-containing gas). The processing condition at this time can be similar to the processing condition of the abovementioned embodiment.

Further for example, when the metal thin film containing Mo (MoO film, MoN film, Mod film, MoON film, MoOC film, MoCN film, and MoOCN film, etc) is formed, gas containing Mo and chloro-groups such as molybdenum penta chloride ($MoCl_5$), or gas containing Mo and fluoro-groups such as Molybdenum penta fluoride ($MoF_5$), can be used as the source gas. The gas similar to the abovementioned gas can be used as the reactive gas (oxygen-containing gas, nitrogen-containing gas, and carbon-containing gas). The processing condition at this time can be similar to the processing condition of the abovementioned embodiment.

That is, the present invention can be suitably used when forming a thin film containing a prescribed element such as a semiconductor element or a metal element, etc.

A process recipe (program specifying a processing procedures and processing conditions) used for the film formation of each kind of thin film, is individually prepared (a plurality of recipes are prepared) according to the content of the substrate processing (such as a film type of the thin film to be formed, composition ratio, film quality, and film thickness, etc.). Then, when substrate processing is started, it is preferable that an appropriate process recipe is suitably selected from a plurality of process recipes according to the content of the substrate processing. Specifically, it is preferable that a plurality of process recipes prepared individually according to the content of the substrate processing are previously stored (installed) in a memory device 121c provided in the substrate processing apparatus, via an electric communication line or a recording medium in which the process recipe is recorded. Then, when substrate processing is started, it is preferable that CPU 121a provided in the substrate processing apparatus suitably selects the appropriate process recipe according to the content of the substrate processing, from the plurality of process recipes stored in the memory device 121c. With this structure, the thin film of various film types, composition ratio, film quality, and film thickness can be formed in general, with good reproducibility, by one substrate processing apparatus. Further, an operation load of an operator (an input load, etc., such as processing procedures and processing conditions, etc.) can be reduced, and the substrate processing can be speedily started while avoiding an operation error.

The abovementioned process recipe is not limited to a newly created case, and for example, the process recipe may be prepared by changing the existent process recipe already installed in the substrate processing apparatus. When the process recipe is changed, the process recipe after change may be installed in the substrate processing apparatus via the electric communication line and the recording medium in which the process recipe is recorded. Further, by operating an input/output device 122 provided in the existent substrate processing apparatus, the existent process recipe already installed in the substrate processing apparatus may be directly changed.

In the abovementioned embodiment, explanation is given for an example of forming the film while improving mainly the in-plane uniformity, using a batch-type substrate processing apparatus for processing a plurality of substrates at once. The present invention is not limited thereto, and for example, can be suitably applied to a case that the film is formed while improving mainly the in-plane uniformity, using a single-wafer type substrate processing apparatus for processing one or several substrates at once. Also, in the abovementioned embodiment, explanation is given for an example of forming the film using the substrate processing apparatus having a hot wall type processing furnace. The present invention is not limited thereto, and can be suitably applied to a substrate processing apparatus having a cold wall type processing furnace. In these cases, the processing condition can be similar to the processing condition of the abovementioned embodiment.

The abovementioned each embodiment can be suitably combined and used. Also, the processing condition at this time can be similar to the processing condition of the abovementioned embodiment for example.

EXAMPLES

In an example of the present invention, processing was performed for forming the SiO film on the wafer by the film formation sequence of the abovementioned embodiment, using the substrate processing apparatus of the abovementioned embodiment. At this time, in supplying BTBAS gas to the wafer, supply of the BTBAS gas and supply of the $N_2$ gas for dispersion were performed in a state that the APC valve was fully-closed and exhaust of the process chamber was stopped. Supply of the $N_2$ gas for dispersion was performed in a state that supply of the BTBAS gas was stopped.

Figure 11:
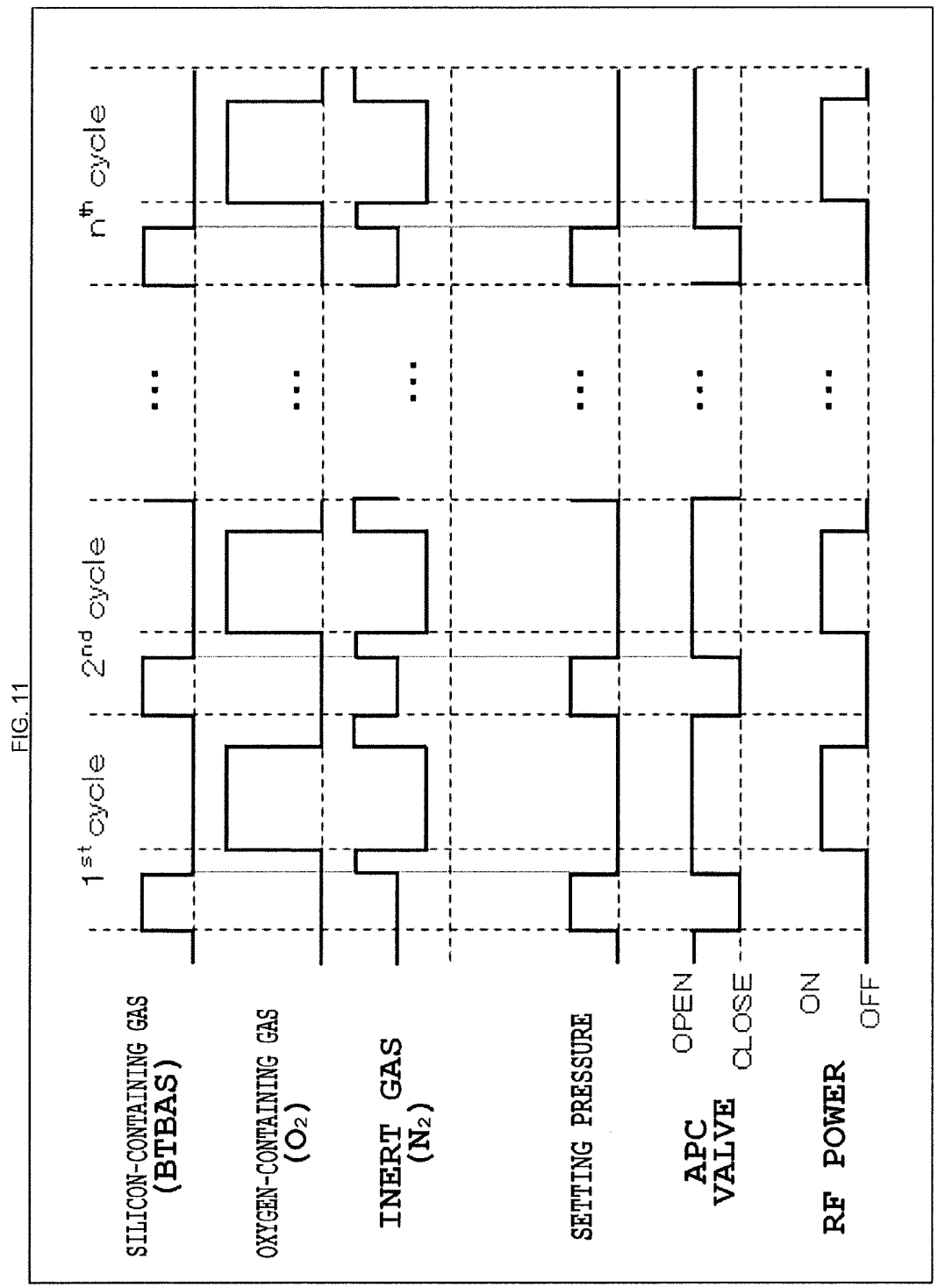
FIG. 11 is a view showing the timing of the gas supply in the film formation sequence of a comparative example.

Further, in a comparative example, processing was performed for forming the SiO film on the wafer by the film formation sequence shown in FIG. 1, using the substrate processing apparatus of the abovementioned embodiment. As shown in FIG. 11, in supplying BTBAS gas to the wafer in the comparative example, BTBAS gas was continuously supplied into the process chamber in a state that exhaust of the process chamber was stopped, without performing supply of the $N_2$ gas for dispersion. After stop of the supply of the BTBAS gas, the residual gas was immediately exhausted.

Figure 7:
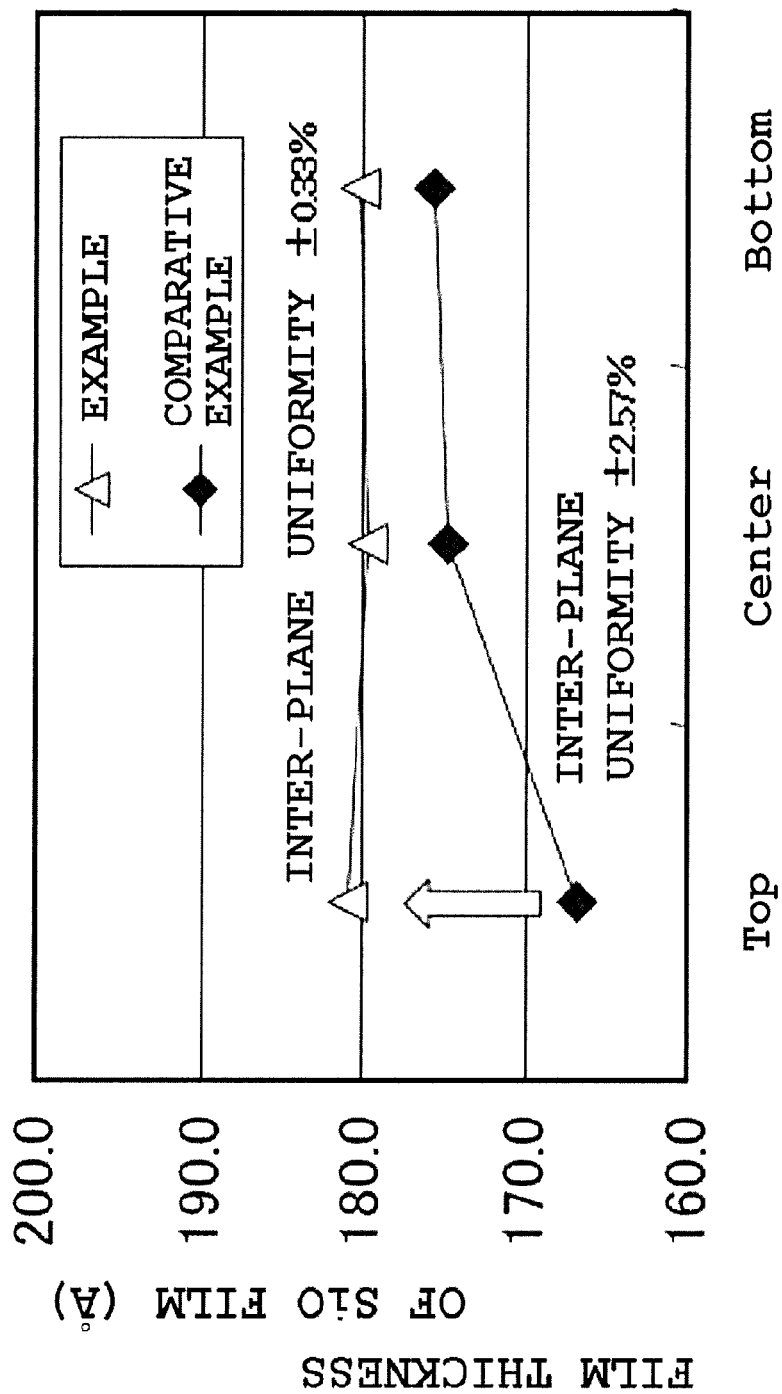
FIG. 7 is a graph showing a film thickness of SiO film and its inter-plane uniformity according to an example and a comparative example of the present invention.

FIG. 7 is a graph showing the in-plane uniformity of the film thickness of the SiO film according to the example and the comparative example. The vertical axis of the graph indicates the film thickness (Å) of the SiO film, and the horizontal axis indicates a housing position of the wafer in the boat (upper stage: Top, middle stage: center, and lower stage: bottom). Δ on the graph indicates the in-plane average film thickness of the SiO film in the wafer of the example at each housing position, and ♦ indicates the in-plane average film thickness of the SiO film in the wafer of the comparative example at each housing position. The numerical value described in the vicinity of each plot of the example and the comparative example indicates the in-plane uniformity (±%) of the film thickness of the SiO film. The in-plane uniformity was obtained by the following formula (1) using a maximum value and a minimum value of the in-plane average film thickness of the SiO film in all wafers, that is, using an inter-plane maximum film thickness and an inter-plane minimum film thickness, and an average value of the film thickness of the SiO film in all wafers, that is, using the inter-plane average film thickness. The inter-plane uniformity indicates the variation of the film thickness of the SiO film between the planes of the wafers, and means that the variation is small (more uniform) as the value becomes smaller.

Inter-plane uniformity=[(inter-plane maximum film thickness−inter-plane minimum film thickness)/(inter-plane average film thickness×2)]×100 (±%)    (1)

According to FIG. 7, the inter-plane uniformity is more improved in the example, than in the comparative example. Particularly, in the example, the film thickness value of the SiO film in the wafer of an upper stage (Top) of the boat is approximately the same as the film thickness value of the SiO film in the wafer of a middle stage (Center) and a lower stage (Bottom) of the boat, compared with the comparative example in which the film thickness of the SiO film in the wafer of an upper stage (Top) of the boat is remarkably low. It can be considered that this is because in the example, BTBAS gas is spread uniformly in the vertical direction of the process chamber. Thus, it is found that the inter-plane uniformity of the film thickness of the SiO film can be improved by forming the SiO film by the film formation sequence of the abovementioned embodiment.

Figure 8:
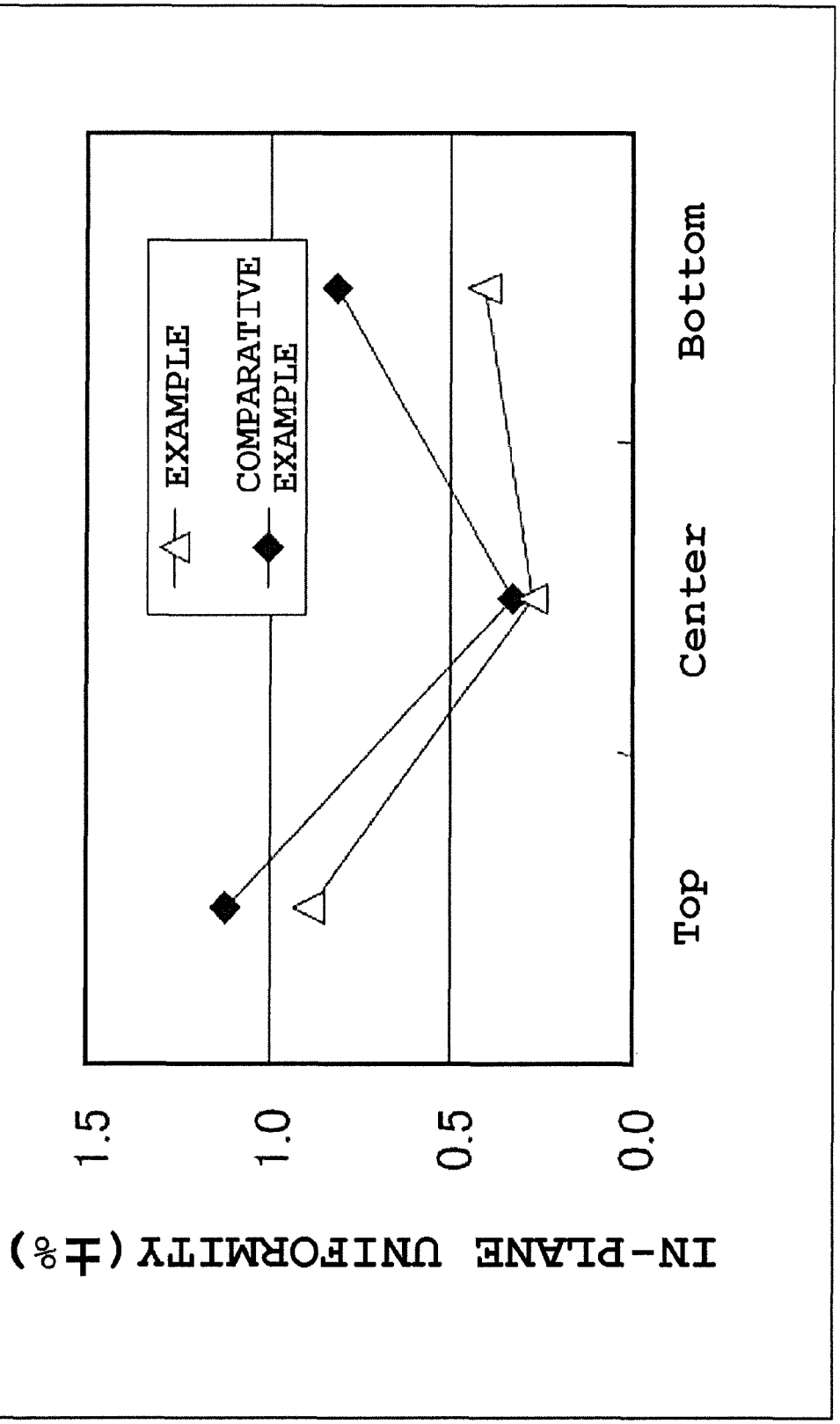
FIG. 8 is a graph showing the in-plane uniformity of the film thickness of the SiO film according to an example and a comparative example of the present invention.

FIG. 8 is a graph showing the in-plane uniformity of the film thickness of the SIC film according to the example and the comparative example. The vertical axis of the graph indicates the in-plane uniformity (±%) of the film thickness of the SiO film, and the horizontal axis indicates the housing position of the wafer in the boat (upper stage: Top, middle stage: Center, lower stage: Bottom). Δ on the graph indicates the in-plane average film thickness of the SiO film in the wafer of the example at each housing position, and ♦ indicates the in-plane average film thickness of the SiO film in the wafer of the comparative example at each housing position. The in-plane uniformity was obtained by the following formula (2) using the maximum value and the minimum value of the film thickness of the SiO film in the plane of the wafer at a prescribed housing position, that is, using the in-plane maximum film thickness and the in-plane minimum film thickness, and the in-plane average film thickness of the SiO film in this wafer. The in-plane uniformity shows the variation of the film thickness of the SiO film in the plane of the wafer, and the variation is small (more uniform) as the value becomes smaller.

In-plane uniformity=[(in-plane maximum film thickness−in-plane minimum film thickness)/(in-plane average film thickness×2)]×100(±%)    (2)

According to FIG. 8, in the example, excellent in-plane uniformity is obtained, which is equivalent to or more than the comparative example, irrespective of the housing position in the boat. It can be considered that this is because in the example, BTBAS gas is uniformly spread not only in the vertical direction but also in the horizontal direction of the process chamber. It is found that the in-plane uniformity of the film thickness of the SiO film can be improved by forming the SiO film by the film formation sequence of the abovementioned embodiment.

Figure 9:
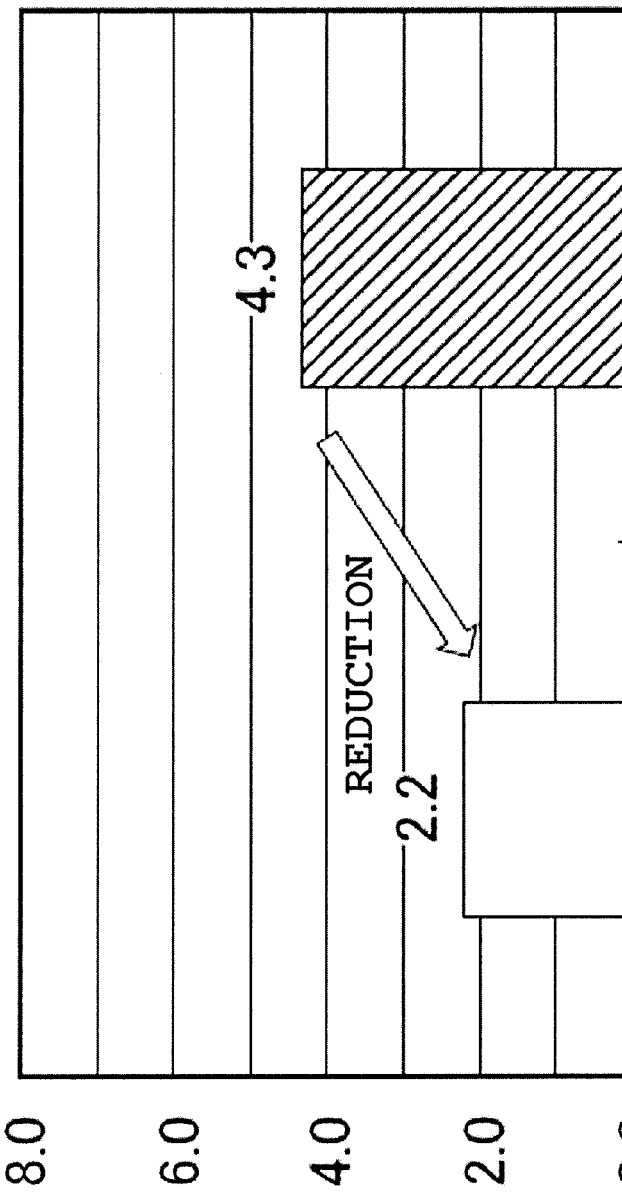
FIG. 9 is a graph showing a use amount of BTBAS gas according to an example and a comparative example of the present invention.

FIG. 9 is a graph showing the use amount of the BTBAS gas according to the example and the comparative example. The vertical axis of the graph indicates the use amount (a.u.: arbitrary unit) of the BTBAS gas in each film formation sequence. The a hollow bar graph on the horizontal axis shows a measurement result of the example, and a slashed bar graph on the horizontal axis shows the measurement result of the comparative example. The use amount of the BTBAS gas is indicated by a numerical value, in the upper part of each bar graph. The use amount of the BTBAS gas is a value calculated by multiplying the supply amount (supply flow rate) of the BTBAS gas per unit time, by the supply time of the BTBAS gas, and is indicated by an arbitrary unit in FIG. 9.

According to FIG. 9, the use amount of the BTBAS gas in the example is more reduced by about 50% than the use amount in the comparative example. By using the film formation sequence of the abovementioned embodiment, it is found that BTBAS gas not contributing to the formation of the silicon-containing layer and uselessly exhausted from the process chamber, can be reduced, and an overall use amount of the BTBAS gas required for forming the SiO film can be reduced.

Subsequently, in the example of the present invention using the film formation sequence of the abovementioned embodiment, the film thickness of the formed SiO film and its in-plane uniformity were measured by varying the supply flow rate of the BTBAS gas per one cycle.

Figure 10:
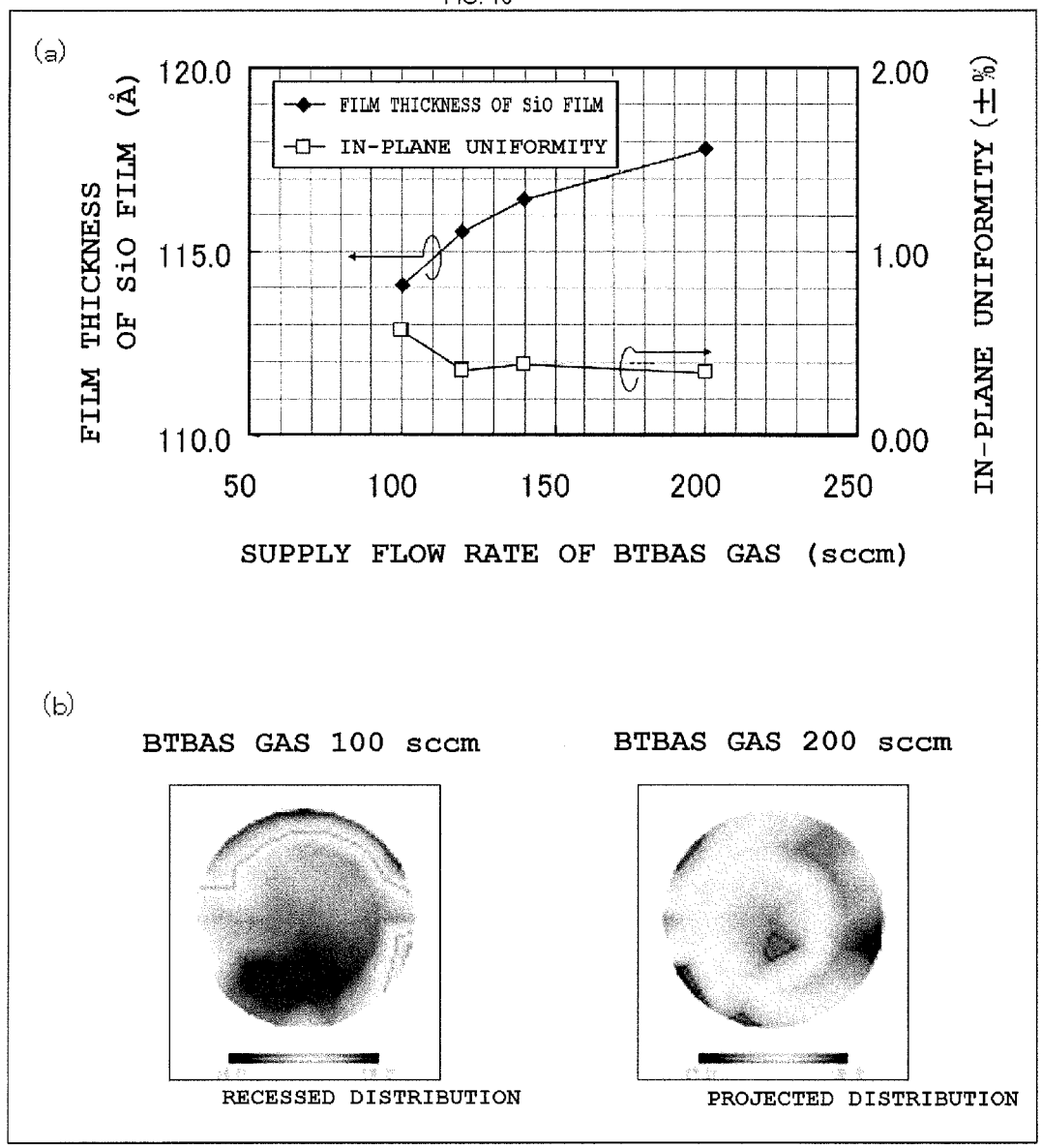
FIG. 10 (a) is a graph showing a relation between a supply flow rate of the BTBAS gas and the film thickness of the SiO film, and a relation between the supply flow rate of the BTBAS gas and the film thickness of the SiO film according to an example of the present invention, and (b) is an in-plane distribution view of the supply flow rate of the BTBAS gas and the film thickness of the SiO film according to an example of the present invention.

FIG. 10 is a view showing measurement data when supply flow rate of the BTBAS gas is varied in the example, wherein (a) is a graph showing the film thickness of the SiO film and its in-plane uniformity, and (b) is an in-plane distribution view of the film thickness of the SiO film. The vertical axis at the left side of the graph in FIG. 10(a) indicates the film thickness (Å) of the SiO film, and the vertical axis at the right side indicates the in-plane uniformity (±%) of the film thickness of the SiO film. The horizontal axis of the graph indicates the supply flow rate (sccm) of the BTBAS gas. ♦ on the graph indicates the in-plane average film thickness of the SiO film in each supply flow rate, and □ indicates the in-plane uniformity of the film thickness of the SiO film in each supply flow rate. The left side of FIG. 10(b) is an in-plane distribution view of the film thickness of the SiO film when supply flow rate of the BTBAS gas is 100 sccm, and the right side is an in-plane distribution view of the film thickness of the SiO film when supply flow rate of the BTBAS gas is 200 sccm.

According to FIG. 10(a), the in-plane uniformity of the film thickness of the SiO film is approximately constant and is maintained satisfactorily, while supply flow rate of the BTBAS gas is increased from 100 sccm to 200 sccm. It can be considered that this is because the film formation sequence of the abovementioned embodiment is used. Also, as shown in FIG. 10(a), when supply flow rate of the BTBAS gas is increased from 100 sccm to 200 sccm, the in-plane average film thickness of the SiO film is increased. Also, as shown in FIG. 10 (b), when supply flow rate of the BTBAS gas is increased from 100 sccm to 200 sccm, the film thickness distribution of the SiO film in plane of the wafer is inverted. That is, when supply flow rate of the BTBAS gas is 100 sccm, the SiO film has a film thickness distribution of a recessed form in which a wafer central portion is thin (thick color region in the figure), and an outer peripheral portion at both sides across the central portion is thick (lighter color region in the figure). On the other hand, when supply flow rate of the BTBAS gas is 200 sccm, the SiO film has a film thickness distribution of a projected form in which the wafer central portion is thick (lighter color region in the figure) and the outer peripheral portion at both sides across the central portion is thin (thick color region in the figure). Thus, in the film formation sequence of the abovementioned embodiment, it is found that the in-plane distribution of the film thickness of the SiO film can be inverted from the recessed form to the projected form, by varying the supply flow rate of the BTBAS gas. That is, it is found that the in-plane uniformity of the film thickness of the SiO film can be more finely controlled, by adjusting the supply flow rate of the BTBAS gas so that the in-plane distribution of the film thickness of the SiO film is more flat.

<Preferable Aspect of the Present Invention>

Preferable aspects of the present invention will be supplementary described hereafter.

(Supplementary Description 1)

According to an aspect of the present invention, there is provided a method for manufacturing a semiconductor device, including:

forming a film on a substrate by performing a cycle a prescribed number of times, the cycle including:

(a) supplying a source gas to the substrate in a process chamber;

(b) exhausting the source gas remained in the process chamber;

(c) supplying a reactive gas to the substrate in the process chamber; and (d) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

Here, "a cycle including each step is performed a prescribed number of times" includes both of a case that the cycle is performed once, and a case that the cycle is performed multiple numbers of times, which means that the cycle is performed once or more (a prescribed number of times). Also, each step with arbitrary number of times and arbitrary order may be included in "supplying the source gas, exhausting the source gas, supplying the reactive gas, and exhausting the reactive gas".

(Supplementary Description 2)

There is provided the method of the supplementary description 1, wherein in (a), pressure in the process chamber is set to be higher than pressure in the process chamber in (c).

(Supplementary Description 3)

There is provided the method of the supplementary description 1 or 2, wherein in (a), pressure in the process chamber is set to be higher than pressure in the process chamber in (b), (c), and (d).

(Supplementary Description 4)

There is provided the method of any one of the supplementary descriptions 1 or 3, wherein in (a), exhaust of the process chamber is stopped or the process chamber is slightly exhausted so that an exhaust rate of a gas supplied into the process chamber, is smaller than a supply rate of the gas supplied into the process chamber.

(Supplementary Description 5)

There is provided the method of any one of the supplementary descriptions 1 or 3, wherein in (a), an exhaust stopped state of the process chamber is maintained.

(Supplementary Description 6)

There is provided the method of any one of the supplementary descriptions 1 or 3, wherein in (b), the source gas remained in the process chamber is exhausted from an exhaust pipe, and in (a), a substantially closed state of an exhaust valve provided in the exhaust pipe is maintained.

(Supplementary Description 7)

There is provided the method of the supplementary description 6, wherein in (a), the exhaust valve is closed, or the exhaust valve is slightly opened so that an exhaust rate of a gas supplied into the process chamber, is smaller than a supply rate of the gas supplied into the process chamber.

(Supplementary Description 8)

There is provided the method of the supplementary description 6, wherein in (a), a closed state (fully-closed state) of the exhaust valve is maintained.

(Supplementary Description 9)

There is provided the method of any one of the supplementary descriptions 1 or 8, wherein an inert gas is supplied into the process chamber when the source gas is supplied into the process chamber, and a flow rate of the inert gas supplied into the process chamber in a substantially stopped state of exhaust of the process chamber and supply of the source gas, is set to be larger than a flow rate of the inert gas supplied into the process chamber when the source gas is supplied into the process chamber.

(Supplementary Description 10)

There is provided the method of any one of the supplementary descriptions 1 to 9, wherein the source gas includes amino-groups.

(Supplementary Description 11)

There is provided the method of any one of the supplementary descriptions 1 to 10, wherein the source gas includes an aminosilane-based source gas.

(Supplementary Description 12)

There is provided the method of any one of the supplementary descriptions 1 to 11, wherein the source gas includes at least any one of bis tertiary butyl amino silane ($SiH_2[NH(C_4H_9)]_2$) gas, tetrakis dimethyl amino silane ($Si[N(CH_3)_2]_4$) gas, trisdimethylaminosilane ($Si[N(CH_3)_2]_3H$) gas and bis diethylaminosilane ($Si[N C_2H_5)_2]_2H_2$) gas.

(Supplementary Description 13)

There is provided the method of any one of the supplementary descriptions 1 to 11, wherein the source gas includes bis tertiary butyl amino silane ($SiH_2[NH(C_4H_9)]_2$) gas.

(Supplementary Description 14)

There is provided the method of any one of the supplementary descriptions 1 to 13, wherein the reactive gas includes an oxygen-containing gas, and the film includes an oxide film.

(Supplementary Description 15)

There is provided the method of any one of the supplementary descriptions 1 to 13, wherein the reactive gas includes an oxygen-containing gas excited by plasma, and the film includes an oxide film.

(Supplementary Description 16)

There is provided the method of any one of the supplementary descriptions 1 to 15, wherein in forming a film on the substrate, a temperature of the substrate is set to a room temperature or more and 200° C. or less.

(Supplementary Description 17)

There is provided the method of any one of the supplementary descriptions 1 to 15, wherein in forming a film on the substrate, a temperature of the substrate is set to a room temperature or more and 150° C. or less.

(Supplementary Description 18)

There is provided the method of any one of the supplementary descriptions 1 to 15, wherein in forming a film on the substrate, a temperature of the substrate is set to a room temperature or more and 100° C. or less.

(Supplementary Description 19)

There is provided the method of any one of the supplementary descriptions 1 to 15, wherein in forming a film on the substrate, a temperature of the substrate is set to a room temperature.

(Supplementary Description 20)

There is provided the method of any one of the supplementary descriptions 1 to 19, wherein forming a film on the substrate is performed in a state that a plurality of substrates are arranged vertically in multiple stages in the process chamber.

(Supplementary Description 21)

According to other aspect of the present invention, there is provided a substrate processing method, including:

forming a film on a substrate by performing a cycle a prescribed number of times, the cycle including:

supplying a source gas to the substrate in a process chamber;

exhausting the source gas remained in the process chamber;

supplying a reactive gas to the substrate in the process chamber; and exhausting the reactive gas remained in the process chamber, wherein in supplying the source gas, the source gas is supplied into the process chamber in a state that exhaust of the process chamber is substantially stopped, and thereafter an inert gas is supplied into the process chamber in a state that exhaust of the process chamber and supply of the source gas are substantially stopped.

(Supplementary Description 22)

According to other aspect of the present invention, there is provided a substrate processing apparatus, including:

a process chamber configured to house a substrate;

a source gas supply system configured to supply a source gas into the process chamber;

a reactive gas supply system configured to supply a reactive gas into the process chamber;

an inert gas supply system configured to supply an inert gas into the process chamber;

an exhaust system configured to exhaust the process chamber; and a controller configured to control the source gas supply system, the reactive gas supply system, the inert gas supply system, and the exhaust system, so that forming a film on the substrate is performed by performing a cycle a prescribed number of times, the cycle including:

(a) supplying the source gas to the substrate in the process chamber;

(b) exhausting the source gas remained in the process chamber;

( ) supplying the reactive gas to the substrate in the process chamber; and (d) exhausting the reactive gas remained in the process chamber, wherein in (a), the source gas is supplied into the process chamber in a state that exhaust of the process chamber is substantially stopped, and thereafter the inert gas is supplied into the process chamber in a state that exhaust of the process chamber and supply of the source gas are substantially stopped.

(Supplementary Description 23)

According to further other aspect of the present invention, there is provided a computer readable non-transitory recording medium recording a program configured to cause a computer to execute forming a film on a substrate by performing a cycle a prescribed number of times, the cycle including:

(a) supplying a source gas to the substrate in a process chamber;

(b) exhausting the source gas remained in the process chamber;

(c) supplying a reactive gas to the substrate in the process chamber; and (c) exhausting the reactive gas remained in the process chamber, wherein in (a), the source gas is supplied into the process chamber in a state that exhaust of the process chamber is substantially stopped, and thereafter an inert gas is supplied into the process chamber in a state that exhaust of the process chamber and supply of the source gas are substantially stopped.

DESCRIPTION OF SIGNS AND NUMERALS

121 Controller (control unit)
200 Wafer (substrate)
201 Process chamber
202 Processing furnace
203 Reaction tube
207 Heater
209 Manifold
231 Exhaust pipe
232a Gas supply pipe
232b Gas supply pipe
244 APC valve (exhaust valve)

The invention claimed is:

1. A method for manufacturing a semiconductor device, comprising:
forming a film on a substrate by performing a cycle a prescribed number of times, the a cycle including:
(a) supplying a source gas to the substrate in a process chamber through a first nozzle;
(b) exhausting the source gas remained in the process chamber;
(c) supplying a reactive gas to the substrate in the process chamber through a second nozzle; and
(d) exhausting the reactive gas remained in the process chamber,
wherein in (a),
the source gas is supplied into the process chamber through the first nozzle when exhaust of the process chamber is substantially stopped, and thereafter
an inert gas is supplied into the process chamber through the first nozzle with a larger flow rate than a flow rate at the time of supplying the source gas, that when the exhaust of the process chamber and supply of the source gas are substantially stopped, and a time for supplying the inert gas when the exhaust of the process chamber and the supply of the source gas are substantially stopped becomes longer than a time for supplying the source gas.

2. The method of claim 1, wherein in (a), pressure in the process chamber is set to be higher than pressure in the process chamber in (c).

3. The method of claim 1, wherein in (a), pressure in the process chamber is set to be higher than pressure in the process chamber in (b), (c), and (d).

4. The method of claim 1, wherein in (a), the exhaust of the process chamber is stopped, when the source gas is supplied, and when the inert gas is supplied, the exhaust of the process chamber and the supply of the source gas are substantially stopped.

5. The method of claim 1, wherein in (a), an exhaust stopped state of the process chamber is maintained, when the source gas is supplied, and when the inert gas is supplied, the exhaust of the process chamber and the supply of the source gas are substantially stopped.

6. The method of claim 1, wherein
in (b), the source gas remained in the process chamber is exhausted from an exhaust pipe in which an exhaust valve is provided, and
in (a), a substantially closed state of the exhaust valve provided in the exhaust pipe is maintained, when the source gas is supplied, and when an inert gas is supplied, the exhaust of the process chamber and the supply of the source gas are substantially stopped.

7. The method of claim 6, wherein in (a), the exhaust valve is closed, when the source gas is supplied, and when the inert gas is supplied, the exhaust of the process chamber and the supply of the source gas are substantially stopped.

8. The method of claim 6, wherein in (a), a closed state of the exhaust valve is maintained, when the source gas is supplied, and when the inert gas is supplied, the exhaust of the process chamber and the supply of the source gas are substantially stopped.

9. The method of claim 6, wherein in (a), the exhaust valve is slightly opened so that an exhaust rate of a gas supplied into the process chamber is smaller than a supply rate of the gas supplied into the process chamber, when the source gas is supplied, and when the inert gas is supplied, the exhaust of the process chamber and the supply of the source gas are substantially stopped.

10. The method of claim 1, wherein
an inert gas is supplied into the process chamber when the source gas is supplied into the process chamber, and
a flow rate of the inert gas supplied into the process chamber in a substantially stopped state of exhaust of the process chamber and supply of the source gas, is set to be larger than a flow rate of the inert gas supplied into the process chamber when the source gas is supplied into the process chamber.

11. The method of claim 1, wherein the source gas includes amino-groups.

12. The method of claim 1, wherein in (a), the process chamber is slightly exhausted so that an exhaust rate of a gas supplied into the process chamber is smaller than a supply rate of the gas supplied into the process chamber, when the source gas is supplied, and when the inert gas is supplied, the exhaust of the process chamber and the supply of the source gas are substantially stopped.

13. The method of claim 1, wherein the first nozzle contains a long nozzle that rises from a lower part of the process chamber to an arrangement region of the substrate.

14. The method of claim 1, wherein in the formation of the film on the substrate, a temperature of the substrate is set to a room temperature or more and 200□C or less.

15. The method of claim 1, wherein in the formation of the film on the substrate, a temperature of the substrate is set to a room temperature.

16. A non-transitory computer readable recording medium recording a program configured to cause a substrate processing apparatus to execute forming a film on a substrate by performing a cycle a prescribed number of times by a computer, the cycle including:
(a) supplying a source gas to the substrate in a process chamber of the substrate processing apparatus through a first nozzle;
(b) exhausting the source gas remained in the process chamber;
(c) supplying a reactive gas to the substrate in the process chamber through a second nozzle; and
(d) exhausting the reactive gas remained in the process chamber,
wherein in (a),
the program is configured to cause the substrate processing apparatus to execute procedure by computer, the procedure including;
supplying the source gas into the process chamber through the first nozzle when exhaust of the process chamber is substantially stopped, and thereafter
supplying an inert gas into the process chamber through the first nozzle with a larger flow rate than a flow rate at the time of supplying the source gas, so that a time for supplying the inert gas during which the exhaust of the process chamber and supply of the source gas are substantially stopped becomes longer than a time for supplying the source gas.

17. A method for manufacturing a semiconductor device, comprising:
forming a film on a substrate by performing a cycle a prescribed number of times, the cycle including:
(a) supplying a source gas to the substrate in a process chamber through a first nozzle;
(b) exhausting the source gas remained in the process chamber;
(c) supplying a reactive gas to the substrate in the process chamber through a second nozzle; and
(d) exhausting the reactive gas remained in the process chamber, wherein in (a),
supplying the source gas into the process chamber through the first nozzle when exhaust of the process chamber is substantially stopped, and thereafter
supplying an inert gas into the process chamber through the first nozzle with a larger flow rate than a flow rate at the time of supplying the source gas when the exhaust of the process chamber and supply of the source gas are substantially stopped,
are repeated multiple number of times.

18. A method for manufacturing a semiconductor device, comprising:
forming a film on a substrate by performing a cycle a prescribed number of times, the cycle including:
(a) supplying a source gas to the substrate in a process chamber through a first nozzle;
(b) exhausting the source gas remained in the process chamber;
(c) supplying a reactive gas to the substrate in the process chamber through a second nozzle; and
(d) exhausting the reactive gas remained in the process chamber,
wherein in (a),
the source gas is supplied into the process chamber with a first flow rate through the first nozzle when exhaust of the process chamber is substantially stopped, and thereafter
an inert gas is supplied into the process chamber through the first nozzle with a larger flow rate than a flow rate at the time of supplying the source gas while the source gas is supplied into the process chamber through the first nozzle with a second flow rate which is smaller than the first flow rate, when the exhaust of the process chamber is substantially stopped.

* * * * *